United States Patent
Lee et al.

(10) Patent No.: US 12,295,223 B2
(45) Date of Patent: May 6, 2025

(54) DISPLAY PANEL AND DISPLAY APPARATUS INCLUDING THE SAME

(71) Applicant: Samsung Display Co., Ltd., Yongin-si (KR)

(72) Inventors: Sunhwa Lee, Yongin-si (KR); Gyungsoon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

(21) Appl. No.: 17/367,110

(22) Filed: Jul. 2, 2021

(65) Prior Publication Data

US 2022/0045160 A1 Feb. 10, 2022

(30) Foreign Application Priority Data

Aug. 10, 2020 (KR) ........................ 10-2020-0099993

(51) Int. Cl.
*H10K 59/131* (2023.01)
*H10K 59/121* (2023.01)
*H10K 59/35* (2023.01)

(52) U.S. Cl.
CPC ....... *H10K 59/131* (2023.02); *H10K 59/1213* (2023.02); *H10K 59/353* (2023.02)

(58) Field of Classification Search
CPC ............... H10K 59/126; H10K 59/353; H10K 59/1213; H10K 59/121
See application file for complete search history.

(56) References Cited

U.S. PATENT DOCUMENTS

| | | | |
|---|---|---|---|
| 10,304,913 B2 | 5/2019 | Choi et al. | |
| 10,629,125 B2 | 4/2020 | Kim et al. | |
| 2017/0154566 A1* | 6/2017 | Ryoo | H10K 59/131 |
| 2017/0294502 A1* | 10/2017 | Ka | H10K 59/131 |
| 2019/0051670 A1* | 2/2019 | Bei | H01L 27/124 |
| 2020/0176527 A1 | 6/2020 | An et al. | |
| 2020/0176538 A1* | 6/2020 | Um | H10K 59/121 |
| 2020/0176542 A1* | 6/2020 | Park | G09G 3/3241 |

(Continued)

FOREIGN PATENT DOCUMENTS

KR 10-2017-0066767 A 6/2017
KR 10-2019-0002931 A 1/2019

(Continued)

*Primary Examiner* — Vongsavanh Sengdara
(74) *Attorney, Agent, or Firm* — Womble Bond Dickinson (US) LLP

(57) ABSTRACT

In a display panel having a main display area, a component area including pixel groups spaced apart from each other, and a transmission area between the pixel groups, the display panel includes: a substrate; a plurality of main display elements on the substrate to correspond to the main display area and main pixel circuits respectively connected to the main display elements; auxiliary display elements on the substrate to respectively correspond to the pixel groups and auxiliary pixel circuits respectively connected to the auxiliary display elements; a first data line and a second data line spaced apart from each other with the component area therebetween; and a detour line connecting the first data line to the second data line, wherein the detour line is on a layer that is closer to the substrate than a layer on which the first data line and the second data line are arranged.

18 Claims, 14 Drawing Sheets

(56) References Cited

U.S. PATENT DOCUMENTS

2020/0212275 A1* 7/2020 Choi ................... H01L 25/0753
2020/0227494 A1 7/2020 Bae et al.

FOREIGN PATENT DOCUMENTS

| KR | 10-2020-0017012 A | 2/2020 |
| KR | 10-2020-0066502 A | 6/2020 |
| KR | 10-2020-0089380 A | 7/2020 |

* cited by examiner

DISPLAY PANEL AND DISPLAY APPARATUS INCLUDING THE SAME

CROSS-REFERENCE TO RELATED APPLICATION

This application claims priority to and the benefit of Korean Patent Application No. 10-2020-0099993, filed on Aug. 10, 2020, in the Korean Intellectual Property Office, the disclosure of which is incorporated by reference herein in its entirety.

BACKGROUND

1. Field

Aspects of one or more example embodiments relate to a display panel and a display apparatus including the same.

2. Description of Related Art

Recently, the usage of display apparatuses has diversified. Also, display apparatuses have become thinner and lighter, and thus, the variety of uses of display apparatuses has expanded.

As display apparatuses are used for various purposes, there may be various methods of designing shapes of the display apparatuses, and functions which may be connected to or associated with display apparatuses have increased.

The above information disclosed in this Background section is only for enhancement of understanding of the background and therefore the information discussed in this Background section does not necessarily constitute prior art.

SUMMARY

Aspects of one or more example embodiments relate to a display panel and a display apparatus including the same, and for example, to a display panel, in which a display area is increased in order to display an image in an area in which a component, which is an electronic element, is arranged, and a display apparatus including the display panel.

Aspects of one or more example embodiments include a display panel, in which a display area is increased so that an image is displayed in an area in which a component, which is an electronic element, is arranged, and a display apparatus including the display panel. However, these characteristics are examples and do not limit the scope of the disclosure.

Additional aspects will be set forth in part in the description which follows and, in part, will be more apparent from the description, or may be learned by practice of the presented embodiments of the disclosure.

According to one or more example embodiments, a display panel includes a main display area and a component area, the component area including pixel groups apart from each other and a transmission area between the pixel groups, the display panel including a substrate, main display elements arranged on the substrate to correspond to the main display area and main pixel circuits respectively connected to the main display elements, auxiliary display elements arranged on the substrate to respectively correspond to the pixel groups and auxiliary pixel circuits respectively connected to the auxiliary display elements, a first data line and a second data line apart from each other with the component area therebetween, and a detour line connecting the first data line to the second data line, wherein the detour line is arranged on a layer that is closer to the substrate than a layer on which the first data line and the second data line are arranged.

According to some example embodiments, the display panel may further include a lower metal layer arranged in the component area between the substrate and the auxiliary pixel circuits and including a lower hole corresponding to the transmission area, and the detour line may be arranged on a same layer as the lower metal layer.

According to some example embodiments, at least a portion of the detour line may be arranged in the main display area.

According to some example embodiments, the display panel may further include a third data line arranged in the component area and connected to the auxiliary pixel circuits.

According to some example embodiments, the display panel may further include an initialization voltage line configured to transmit an initialization voltage to the main pixel circuits in the main display area and extending in a first direction, and a portion of the detour line, the portion extending in the first direction, may overlap the initialization voltage line.

According to some example embodiments, a portion of the detour line, the portion extending in a second direction that is parallel to the first data line, may overlap a fourth data line connecting the main pixel circuits in the main display area.

According to some example embodiments, the display panel may further include a connection electrode arranged between the detour line and the first data line. The connection electrode may be connected to the detour line through a first contact hole, and the first data line may be connected to the connection electrode through a second contact hole.

According to one or more example embodiments, a display panel includes a main display area and a component area, the component area including pixel groups apart from each other and a transmission area between the pixel groups, the display panel including a substrate, main display elements arranged on the substrate to correspond to the main display area and main pixel circuits respectively connected to the main display elements, auxiliary display elements arranged on the substrate to respectively correspond to the pixel groups and auxiliary pixel circuits respectively connected to the auxiliary display elements, a lower metal layer arranged in the component area between the substrate and the auxiliary pixel circuits and including a lower hole corresponding to the transmission area, a first data line and a second data line apart from each other with the component area therebetween, and a detour line connecting the first data line to the second data line, wherein the detour line is arranged in the main display area and arranged on a same layer as the lower metal layer.

According to some example embodiments, the main pixel circuits may include a driving thin-film transistor, a switching thin-film transistor, and an initialization thin-film transistor, and a portion of the detour line, the portion extending in a first direction, may overlap an initialization voltage line configured to transmit an initialization voltage to the initialization thin-film transistor.

According to some example embodiments, a portion of the detour line, the portion extending in a second direction crossing the first direction, may at least partially overlap a fourth data line configured to transmit a data signal to the switching thin-film transistor.

According to some example embodiments, the display panel may further include a connection electrode arranged between the detour line and the first data line. The connection electrode may be connected to the detour line through a first contact hole, and the first data line may be connected to the connection electrode through a second contact hole.

According to some example embodiments, the display panel may further include a third data line arranged in the component area and connected to the auxiliary pixel circuits.

According to some example embodiments, the third data line may be curved along a shape of the transmission area.

According to one or more example embodiments, a display apparatus includes a display panel including a main display area including main sub-pixels and a component area including a plurality of pixel groups and a transmission area, and a component arranged below the display panel to correspond to the component area, wherein the display panel further includes a substrate, main display elements arranged on the substrate to correspond to the main display area and main pixel circuits respectively connected to the main display elements, auxiliary display elements arranged on the substrate to respectively correspond to the pixel groups and auxiliary pixel circuits respectively connected to the auxiliary display elements, a first data line and a second data line apart from each other with the component area therebetween, and a detour line connecting the first data line to the second data line, wherein the detour line is arranged on a layer that is closer to the substrate than a layer on which the first data line and the second data line are arranged.

According to some example embodiments, the display apparatus may further include a lower metal layer arranged in the component area between the substrate and the auxiliary pixel circuits and including a lower hole corresponding to the transmission area, and the detour line may be arranged on a same layer as the lower metal layer.

According to some example embodiments, at least a portion of the detour line may be arranged in the main display area.

According to some example embodiments, the display apparatus may further include a third data line arranged in the component area and connected to the auxiliary pixel circuits.

According to some example embodiments, the display apparatus may further include an initialization voltage line configured to transmit an initialization voltage to the main pixel circuits in the main display area and extending in a first direction, and a portion of the detour line, the portion extending in the first direction, may overlap the initialization voltage line.

According to some example embodiments, a portion of the detour line, the portion extending in a second direction that is parallel to the first data line, may overlap a fourth data line connecting the main pixel circuits in the main display area.

According to some example embodiments, the display apparatus may further include a connection electrode arranged between the detour line and the first data line. The connection electrode may be connected to the detour line through a first contact hole, and the first data line may be connected to the connection electrode through a second contact hole.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
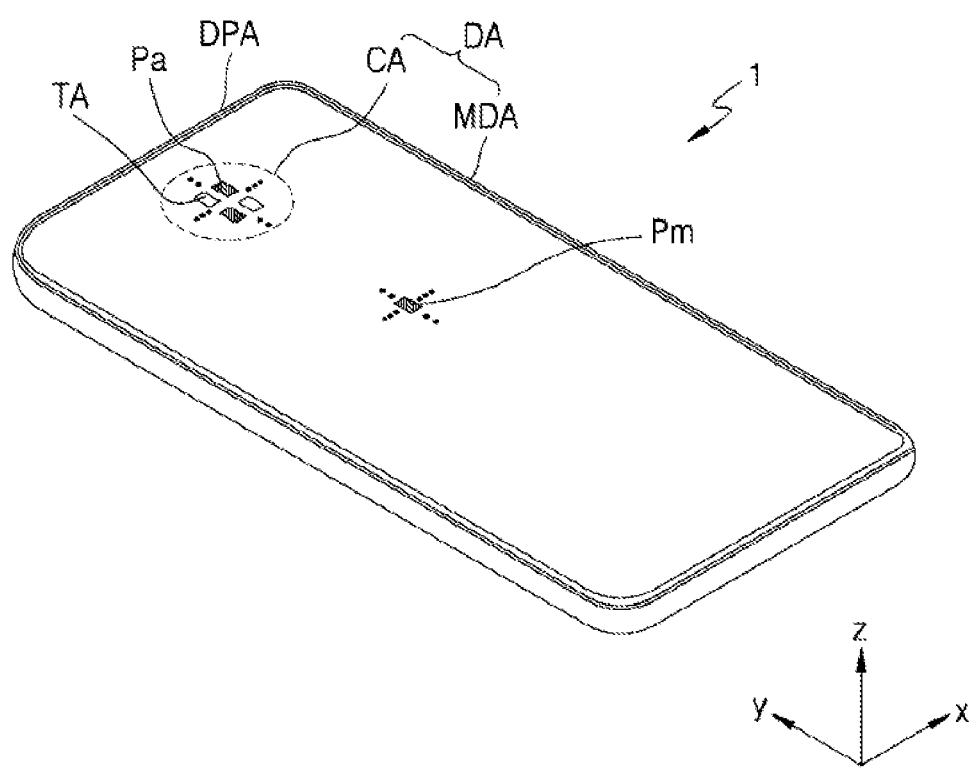
FIG. 1 is a schematic perspective view of a display apparatus according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, embodiments according to the present disclosure are not limited to the embodiments disclosed hereinafter and may be realized in various forms.

Hereinafter, aspects of some example embodiments of the disclosure will be described in more detail by referring to the accompanying drawings. In descriptions with reference to the drawings, the same reference numerals are given to components that are the same or substantially the same and descriptions will not be repeated.

In embodiments to be described hereinafter, when elements, such as a layer, a film, an area, a plate, etc. are referred to as being "on" another element, the reference may indicate not only a case where the element is "directly on" the other element, but also a case where yet another element is between the element and the other element. Also, for convenience of explanation, elements in the drawings may have exaggerated or reduced sizes. For example, sizes and thicknesses of the elements in the drawings are randomly indicated for convenience of explanation, and thus, embodiments according to the present disclosure are not necessarily limited to the illustrations of the drawings.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to some example embodiments.

Referring to FIG. 1, the display apparatus 1 may include a display area DA and a peripheral area DPA outside the display area DA. The display area DA may include a component area CA and a main display area MDA at least partially surrounding the component area CA. That is, each of the component area CA and the main display area MDA may separately or together display an image. The peripheral area DPA may include a type of non-display area in which display elements are not arranged. The display area DA may be entirely surrounded by the peripheral area DPA.

FIG. 1 illustrates that one component area CA is located in the main display area MDA. According to some example embodiments, the display apparatus 1 may include two or more component areas CA, wherein the component areas CA may have different shapes and sizes from each other. When the component area CA is seen from the perspective that is approximately perpendicular or normal with respect to an upper surface of the display apparatus 1 (e.g., from a plan view), the component area CA may have various shapes, such as a polygonal shape including a circular shape, an oval shape, a quadrangular shape, etc., a star shape, a diamond shape, etc. Also, FIG. 1 illustrates that the component area CA is arranged at the upper center side (a +y direction) of the main display area MDA that has an approximately quadrangular shape when seen from a direction approximately perpendicular to the upper surface of the display apparatus 1. However, the component area CA may be arranged at a side of the main display area MDA that has the quadrangular shape, wherein the side includes, for example, an upper right side or an upper left side.

The display apparatus 1 may display images by using a plurality of main sub-pixels Pm arranged in the main display area MDA and a plurality of auxiliary sub-pixels Pa arranged in the component area CA.

As described below with reference to FIG. 2, a component 40, which is an electronic element, may be arranged below the display panel to correspond to the component area CA. The component 40 may correspond to a camera using infrared rays or visible rays and may include a capturing device. Alternatively, the component 40 may include a solar battery, a flash device, an illuminance sensor, a proximity sensor, an iris sensor, etc. Alternatively, the component 40 may have a function to receive sound. To prevent the restriction of functions of the component 40 as much as possible, the component area CA may include a transmission area TA through which light and/or sound (or other signals) may pass through, the light and/or the sound being output from the component 40 to the outside or progressing toward the component 40 from the outside. In the case of a display panel and a display apparatus including the display panel according to some example embodiments, when light is transmitted through the component area CA, a light transmittance may be about 10% or greater, more specifically, about 40% or greater, about 25% or greater, about 50% or greater, about 85% or greater, or about 90% or greater.

The plurality of auxiliary sub-pixels Pa may be arranged in the component area CA. The plurality of auxiliary sub-pixels Pa may emit light to provide a certain image. The image displayed in the component area CA may correspond to an auxiliary image, which may have a lower resolution than an image displayed in the main display area MDA. That is, in a case where the component area CA includes the transmission area TA through which light and/or sound may be transmitted, and sub-pixels are not arranged in the transmission area TA, the number of auxiliary sub-pixels Pa arranged per unit area in the component area CA may be less than the number of main sub-pixels Pm arranged per unit area in the main display area MDA.

Figure 2:
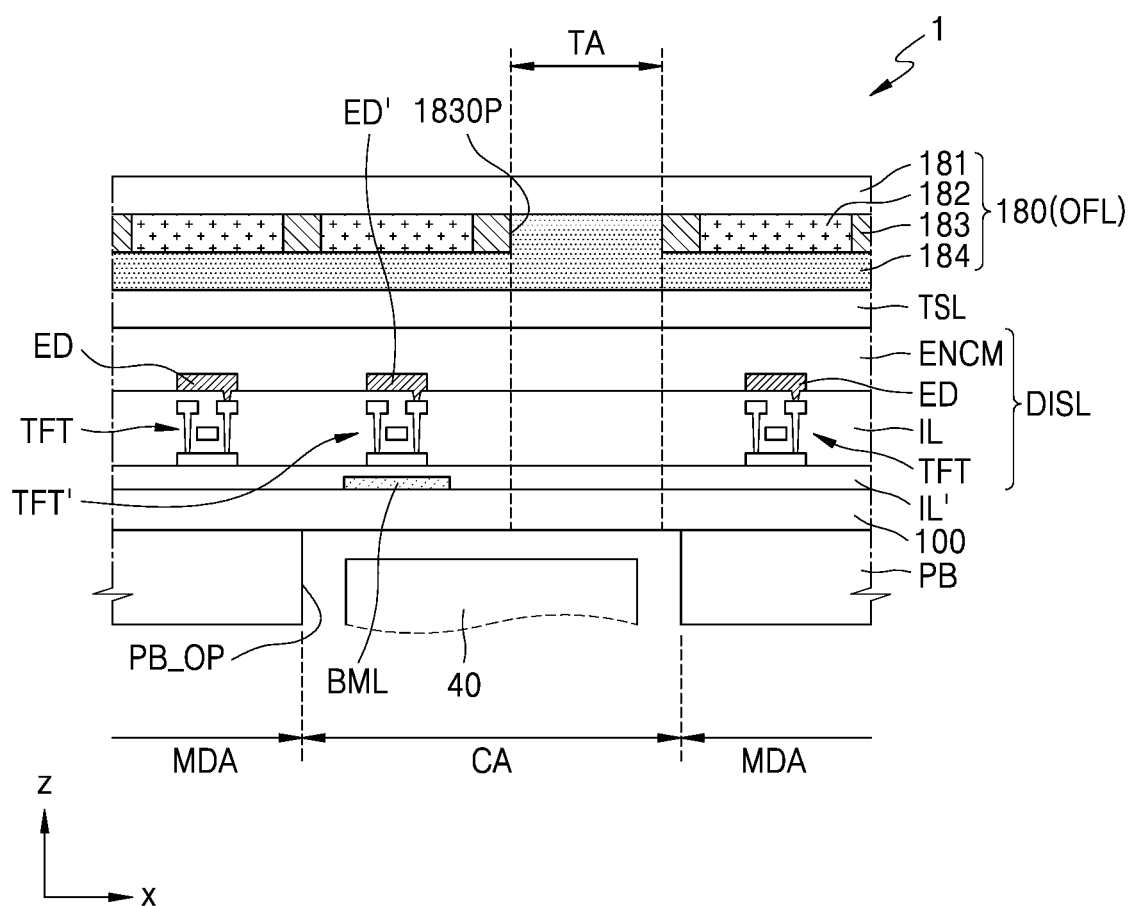
FIG. 2 is a schematic cross-sectional view of a portion of a display apparatus according to some example embodiments.

FIG. 2 is a schematic cross-sectional view of a portion of the display apparatus 1 according to some example embodiments.

Referring to FIG. 2, the display apparatus 1 may include a display panel 10 and the component 40 arranged to overlap the display panel 10. According to some example embodiments, a cover window protecting the display panel 10 may further be arranged above the display panel 10.

The display panel 10 may include the component area CA, which is an area overlapping the component 40, and the main display area MDA in which a main image is displayed. The display panel 10 may include a substrate 100, a display layer DISL on the substrate 100, a touch screen layer TSL, an optical functional layer OFL, and a panel protection member PB below the substrate 100.

The display layer DISL may include a circuit layer PCL including main and auxiliary thin-film transistors TFT and TFT', a display element layer including main and auxiliary light-emitting elements ED and ED', which are display elements, and an encapsulation member ENCM, such as a thin-film encapsulation layer TFEL or an encapsulation substrate. A main insulating layer IL and an auxiliary insulating layer IL' may be arranged in the display layer DISL between the substrate 100 and the display layer DISL.

The substrate 100 may include an insulating material, such as glass, quartz, polymer resins. The substrate 100 may include a rigid substrate or a flexible substrate, which may be bent, folded, or rolled.

The main thin-film transistor TFT and the main light-emitting element ED connected thereto may be arranged in the main display area MDA of the display panel 10 to realize main sub-pixels Pm. The auxiliary thin-film transistor TFT' and the auxiliary light-emitting element ED' connected thereto may be arranged in the component area CA of the display panel 10 to realize auxiliary sub-pixels Pa. An area of the component area CA, in which the auxiliary sub-pixels Pa are arranged, may be referred to as an auxiliary display area ADA.

Also, the component area CA may include the transmission area TA in which a display element is not arranged. The transmission area TA may be an area through which light/a signal emitted from or incident into the component 40 may pass through, the component 40 being arranged to correspond to the component area CA. The auxiliary display area ADA and the transmission area TA may be alternately arranged in the component area CA.

A lower metal layer BML may be arranged in the component area CA. The lower metal layer BML may be arranged to correspond to a lower portion of the auxiliary thin film transistor TFT'. For example, the lower metal layer BML may be arranged between the auxiliary thin-film transistor TFT' and the substrate 100. The lower metal layer BML may prevent or reduce instances of external light reaching the auxiliary thin film transistor TFT'. In some example embodiments, a constant voltage or a signal may be applied to the lower metal layer BML to prevent or reduce damage to a pixel circuit caused by an electrostatic discharge.

The display layer DISL may be covered by the thin-film encapsulation layer TFEL or the encapsulation substrate. In some example embodiments, the thin-film encapsulation layer TFEL may include at least one inorganic encapsulation layer and at least one organic encapsulation layer as illustrated in FIG. 2. According to some example embodiments, the thin-film encapsulation layer TFEL may include a first inorganic encapsulation layer, a second inorganic encapsulation layer, and an organic encapsulation layer therebetween.

The first and second inorganic encapsulation layers may include one or more inorganic insulating materials from among aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include an acryl-based resin, an epoxy-based resin, polyimide, polyethylene, etc.

When the display layer DISL is encapsulated by the encapsulation substrate, the encapsulation substrate may be arranged to face the substrate 100 with the display layer DISL between the encapsulation substrate and the substrate 100. The encapsulation substrate and the display layer DISL may have a gap therebetween. The encapsulation substrate may include glass. A sealant including frit, etc. may be arranged between the substrate 100 and the encapsulation substrate, and the sealant may be arranged in the peripheral area DPA described above. The sealant arranged in the peripheral area DPA may surround the display area DA and prevent or reduce the penetration of water through a side surface of the display area DA.

The touch screen layer TSL may obtain coordinate information based on an external input, for example, a touch event. The touch screen layer TSL may include a touch electrode and touch lines connected to the touch electrode. The touch screen layer TSL may sense an external input based on a magnetic capacitance method or a mutual capacitance method.

The touch screen layer TSL may be formed on the thin-film encapsulation layer TFEL. Alternatively, the touch screen layer TSL may be separately formed on a touch substrate and then may be coupled onto the thin-film encapsulation layer TFEL through an adhesive layer, such as an optical clear adhesive (OCA). According to some example embodiments, the touch screen layer TSL may be formed directly above the thin-film encapsulation layer TFEL, and in this case, the adhesive layer may not be arranged between the touch screen layer TSL and the thin-film encapsulation layer TFEL.

The optical functional layer OFL may be provided to increase visibility. The optical functional layer OFL may include a filter plate 180 including a black matrix 183 and color filters 182 as illustrated in FIG. 2. The filter plate 180 may include a base layer 181, the color filters 182 on the base layer 181, the black matrix 183, and an overcoat layer 184.

The color filters 182 may be arranged by taking into account a color of light emitted from each of pixels in the display panel 10. For example, the color filters 182 may have a red, green, or blue color according to a color of light emitted from the main and auxiliary light-emitting elements ED and ED'. The color filters 182 and the black matrix 183 may not be arranged in the transmission area TA. For example, a layer including the color filters 182 and the black matrix 183 may include a hole 183OP corresponding to the transmission area TA, and the hole 183OP may be at least partially filled with a portion of the overcoat layer 184. The overcoat layer 184 may include an organic material, such as resins, wherein the organic material may be transparent.

A cover window may be arranged above the display panel 10 to protect the display panel 10. The optical functional layer OFL may be coupled onto the cover window or the touch screen layer TSL via an OCA.

The panel protection member PB may be coupled under the substrate 100 to support and protect the substrate 100. The panel protection member PB may include an opening PB_OP corresponding to the component area CA. When the panel protection member PB includes the opening PB_OP, the light transmittance of the component area CA may be improved. The panel protection member PB may include polyethylene terephthalate (PET) or polyimide (PI).

The component area CA may have a greater area than the component 40. Accordingly, an area of the opening PB_OP provided in the panel protection member PB may not correspond to an area of the component area CA.

Also, a plurality of components 40 may be arranged in the component area CA. The plurality of components 40 may have different functions from one another. For example, the plurality of components 40 may include at least two of a camera (an imaging device), a solar battery, a flash device, a proximity sensor, an illuminance sensor, and an iris sensor.

Figure 3:
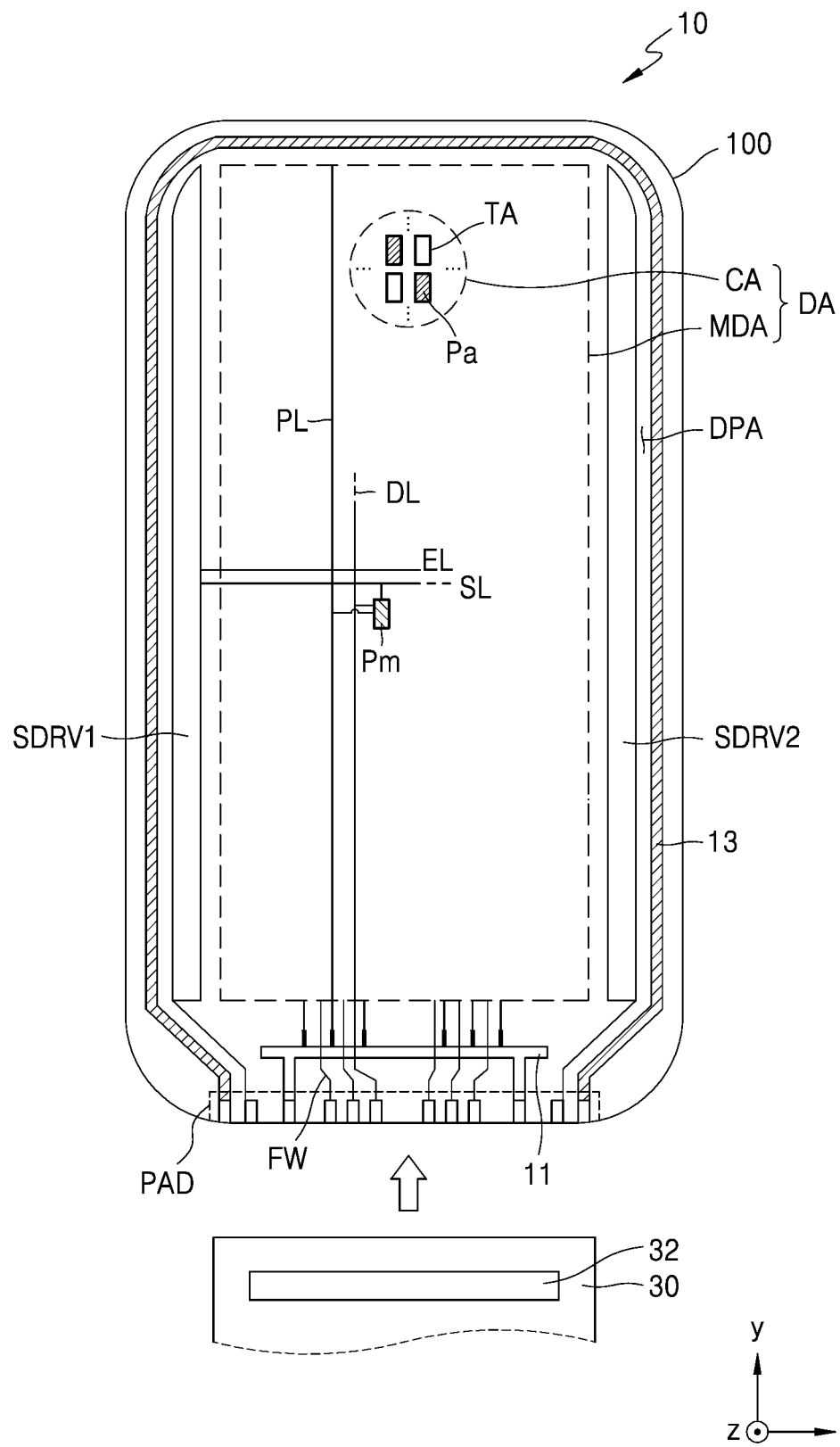
FIG. 3 is a schematic plan view of a display panel, which may be included in the display apparatus of FIG. 1.

FIG. 3 is a schematic plan view of the display panel 10 according to some example embodiments.

Referring to FIG. 3, various components included in the display panel 10 may be arranged above the substrate 100. The substrate 100 may include the display area DA and the peripheral area DPA surrounding the display area DA. The display area DA may include the main display area MDA, in which a main image is displayed, and the component area CA, in which an auxiliary image is displayed, wherein the component area CA includes the transmission area TA. The auxiliary image may form a general image with the main image or may be a separate image from the main image.

The plurality of main sub-pixels Pm may be arranged in the main display area MDA. Each of the main sub-pixels Pm may be realized as a display element such as an organic light-emitting diode (OLED). Each main sub-pixel Pm may emit, for example, a red, green, blue, or white light. The main display area MDA may be covered by an encapsulation member and may be protected from external materials, moisture, etc.

The component area CA may be located at a side of the main display area MDA as described above, or may be arranged in the display area DA and surrounded by the main display area MDA. The plurality of auxiliary sub-pixels Pa may be arranged in the component area CA. Each of the auxiliary sub-pixels Pa may be realized as a display element such as an OLED. Each auxiliary sub-pixel Pa may emit, for example, a red, green, blue, or white light. The component area CA may be covered by an encapsulation member and may be protected from external materials, moisture, etc.

The component area CA may have the transmission area TA. The transmission area TA may be arranged to surround the plurality of auxiliary sub-pixels Pa. Alternatively, the transmission area TA may be arranged to form a grid shape with the plurality of auxiliary sub-pixels Pa.

Because the component area CA has the transmission area TA, a resolution of the component area CA may be lower than a resolution of the main display area MDA. For example, the resolution of the component area CA may be about ½, ⅜, ⅓, ¼, ⅖, ⅛, ⅑, 1/16, etc. of the resolution of the main display area MDA. For example, the resolution of the main display area may be about 400 ppi or higher, and the resolution of the component area CA may be about 200 ppi or about 100 ppi.

Each of pixel circuits driving the main and auxiliary sub-pixels Pm and Pa may be electrically connected to external circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may be configured to apply a scan signal to each of the pixel circuits driving the main and auxiliary sub-pixels Pm and Pa through a second scan line SL. The first scan driving circuit SDRV1 may be configured to apply an emission control signal to each pixel circuit through an emission control line EL. The second scan driving circuit SDRV2 may be located on the opposite side to the first scan driving circuit SDRV1 based on the main display area MDA and may be approximately parallel with the first scan driving circuit SDRV1. One or more of the pixel circuits of the main sub-pixels Pm of the main display area MDA may be electrically connected to the first scan driving circuit SDRV1, and the others may be electrically connected to the second scan driving circuit SDRV2. One or more of the pixel circuits of the auxiliary sub-pixels Pa of the component area CA may be electrically connected to the first scan driving circuit SDRV1, and the others may be electrically connected to the second scan driving circuit SDRV2. The second scan driving circuit SDRV2 may be omitted.

The terminal portion PAD may be arranged at a side of the substrate 100. The terminal portion PAD may not be covered by an insulating layer and may be exposed so as to be connected to a display circuit board 30. A display driver 32 may be arranged in the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the pixel circuits of the main and auxiliary sub-pixels Pm and Pa through a fan-out wire FW and a data line DL connected to the fan-out wire FW.

The display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may be applied to an opposite electrode of the display element by being connected to the common voltage supply line 13.

The driving voltage supply line 11 may be provided under the main display area MDA to extend in an x direction. The common voltage supply line 13 may have a loop shape having an open side and may partially surround the main display area MDA.

FIG. 3 illustrates the case in which there is one component area CA. However, there may be a plurality of component areas CA. In this case, the plurality of component areas CA may be arranged to be apart from each other, a first camera may be arranged to correspond to one component area CA, and a second camera may be arranged to correspond to another component area CA. Alternatively, a camera may be arranged to correspond to one component area CA, and an infrared sensor may be arranged to correspond to another component area CA. The plurality of component areas CA may have different shapes and sizes from each other.

The component area CA may be provided to have a polygonal shape. For example, the component area CA may be provided to have an octagonal shape. The component area CA may be provided to have various polygonal shapes, such as a quadrangular shape, a hexagonal shape, etc. The component area CA may be surrounded by the main display area MDA.

Figure 4:
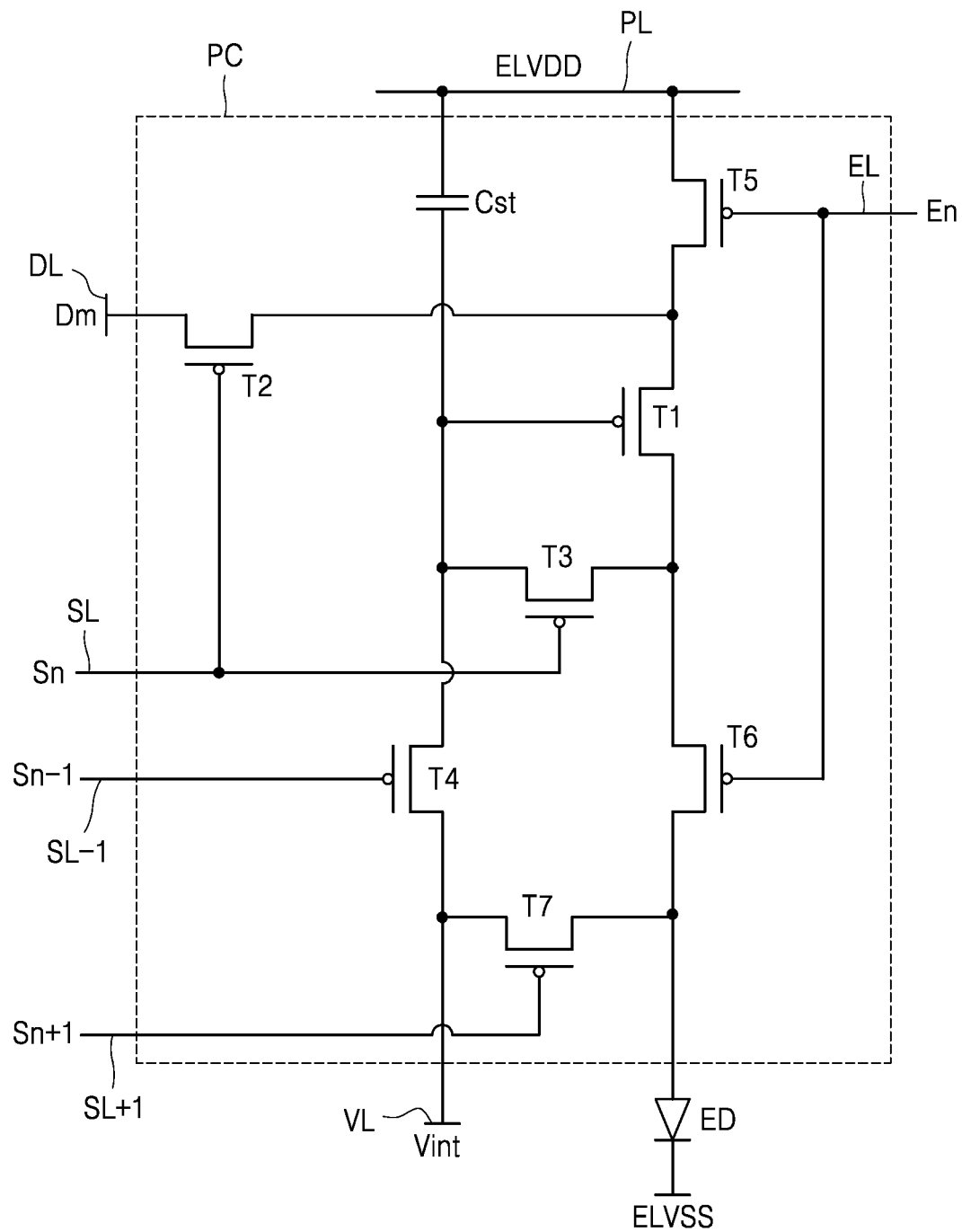
FIG. 4 is an equivalent circuit diagram of a pixel circuit driving a sub-pixel, according to some example embodiments.

FIG. 4 is an equivalent circuit diagram of a pixel circuit PC driving a main or auxiliary sub-pixel, according to some example embodiments.

Referring to FIG. 4, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

FIG. 4 illustrates the case where each pixel circuit PC includes signal lines (including the second scan line SL, a first scan line SL−1, a third scan line SL+1, an emission control line EL, and a data line DL), an initialization voltage line VL, and a driving voltage line PL. However, embodiments according to the present disclosure are not limited thereto. According to some example embodiments, at least one of the signal lines SL, SL−1, SL+1, EL, or DL and/or the initialization voltage line VL may be shared by neighboring pixel circuits.

A drain electrode of the driving thin-film transistor T1 may be electrically connected to the light-emitting element ED through the emission control thin-film transistor T6. The driving thin-film transistor T1 may be configured to receive a data signal Dm according to a switching operation of the switching thin-film transistor T2 and supply a driving current to the light-emitting element ED.

A gate electrode of the switching thin-film transistor T2 may be connected to the second scan line SL, and a source electrode of the switching thin-film transistor T2 may be connected to the data line DL. A drain electrode of the switching thin-film transistor T2 may be connected to a source electrode of the driving thin-film transistor T1 and may be connected to the driving voltage line PL through the operation control thin-film transistor T5.

The switching thin-film transistor T2 may be turned on in response to a scan signal Sn transmitted through the second scan line SL and may perform a switching operation of transmitting a data signal Dm transmitted through the data line DL to the source electrode of the driving thin-film transistor T1.

A gate electrode of the compensation thin-film transistor T3 may be connected to the second scan line SL. A source electrode of the compensation thin-film transistor T3 may be connected to the drain electrode of the driving thin-film transistor T1 and may be connected to a pixel electrode of the light-emitting element ED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 may be turned on in response to a scan signal Sn transmitted through the second scan line SL to connect the gate electrode of the driving thin-film transistor T1 with the drain electrode of the driving thin-film transistor T1, thereby diode-connecting the driving thin-film transistor T1.

A gate electrode of the first initialization thin-film transistor T4 may be connected to the first scan line SL−1. A drain electrode of the first initialization thin-film transistor T4 may be connected to the initialization voltage line VL. A source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the first scan line SL−1 and may perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the light-emitting element ED. The operation control thin-film transistor T5 and the emission control thin-film transistor T6 may be simultaneously turned on in response to an emission control signal En received through the emission control line EL so that the driving voltage ELVDD may be transmitted to the light-emitting element ED and a driving current may flow in the light-emitting element ED.

A gate electrode of the second initialization thin-film transistor T7 may be connected to the third scan line SL+1. A source electrode of the second initialization thin-film transistor T7 may be connected to the pixel electrode of the light-emitting element ED. A drain electrode of the second initialization thin-film transistor T7 may be connected to the initialization voltage line VL. The second initialization thin-film transistor T7 may be turned on in response to a next scan signal Sn+1 received through the third scan line SL+1 and may initialize the pixel electrode of the light-emitting element ED.

FIG. 4 illustrates the case where the first initialization thin-film transistor T4 and the second initialization thin-film transistor T7 are respectively connected to the first scan line SL−1 and the third scan line SL+1. However, embodiments according to the present disclosure are not limited thereto. According to some example embodiments, both of the first initialization thin-film transistor T4 and the second initialization thin-film transistor T7 may be connected to the first scan line SLn−1 and driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (for example, a cathode) of the light-emitting element ED may receive the common voltage ELVSS. The light-emitting element ED may emit light by receiving a driving current from the driving thin-film transistor T1.

The pixel circuit PC is not limited to the number and circuit designs of the thin-film transistors and the storage capacitors described with reference to FIG. 4, and may be variously modified. The pixel circuits PC for driving the main sub-pixel Pm and the auxiliary sub-pixel Pa may be the same as or different from each other.

Figure 5:
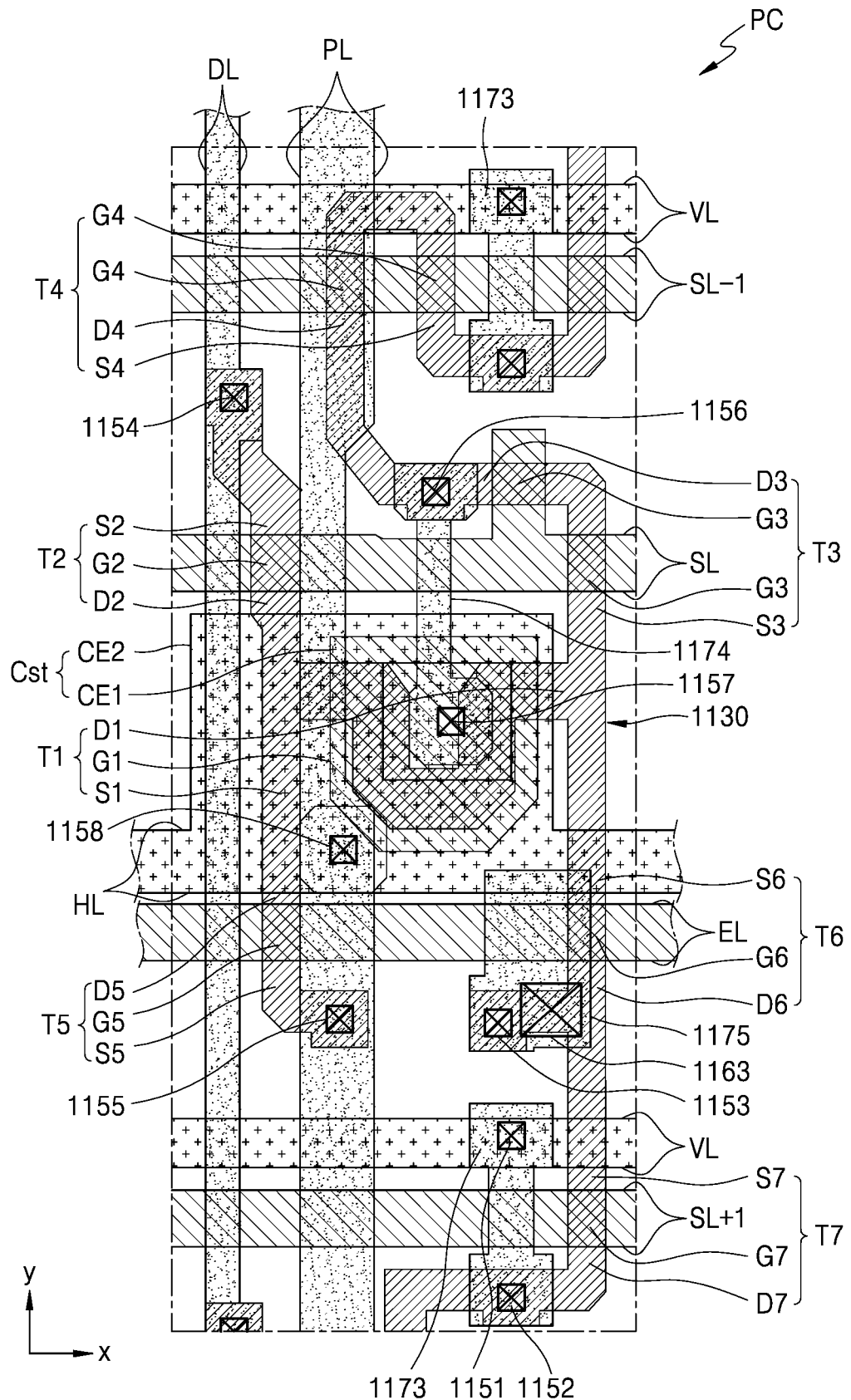
FIG. 5 is a plan view of a pixel circuit of any one pixel, according to some example embodiments.

FIG. 5 is a plan view of a pixel circuit of any one pixel, according to some example embodiments.

Referring to FIG. 5, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be arranged along a semiconductor layer 1130. The semiconductor layer 1130 may be arranged on a substrate, on which a buffer layer including an inorganic insulating material is formed.

One or more areas of the semiconductor layer 1130 may correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be connected to one another and curved in various shapes.

The semiconductor layer 1130 may include a channel area, a source area and a drain area at both sides of the channel area, and it may be understood that the source area and the drain area may correspond to a source electrode and a drain electrode of a corresponding thin-film transistor. Hereinafter, the source area and the drain area will be referred to as the source electrode and the drain electrode, respectively.

The driving thin-film transistor T1 may include a driving gate electrode G1 overlapping a driving channel area, a driving source electrode S1 and a driving drain electrode D1 at both sides of the driving channel area. The driving channel area overlapping the driving gate electrode G1 may have a bent shape, such as an omega shape, so as to form a great channel length in a small space. When the length of the driving channel area is increased, a driving range of a gate voltage may be increased, and thus, a gradation of light emitted from an OLED, which is a light-emitting element, may be more finely controlled, and display quality may be improved.

The switching thin-film transistor T2 may include a switching gate electrode G2 overlapping a switching channel area, a switching source electrode S2 and a switching drain electrode D2 at both sides of the switching channel area. The switching drain electrode D2 may be connected to the driving source electrode S1.

The compensation thin-film transistor T3 may correspond to a dual thin-film transistor and may include compensation gate electrodes G3 overlapping two compensation channel areas, compensation source electrodes S3 and compensation drain electrodes D3 at both sides of the compensation gate electrodes G3. The compensation thin-film transistors T3 may be connected to the driving gate electrode G1 of the driving thin-film transistor T1 through a node connection line 1174 to be described below.

The first initialization thin-film transistor T4 may correspond to a dual thin-film transistor and may include first initialization gate electrodes G4 overlapping two first initialization channel areas, first initialization source electrodes S4 and first initialization drain electrodes D4 at both sides of the first initialization gate electrodes G4.

The operation control thin-film transistor T5 may include an operation control gate electrode G5 overlapping an operation control channel area, an operation control source electrode S5 and an operation control drain electrode D5 at both sides of the operation control gate electrode G5. The operation control drain electrode D5 may be connected to the driving source electrode S1.

The emission control thin-film transistor T6 may include an emission control gate electrode G6 overlapping an emission control channel area, an emission control source electrode S6 and an emission control drain electrode D6 at both sides of the emission control gate electrode G6. The emission control source electrode S6 may be connected to the driving drain electrode D1.

The second initialization thin-film transistor T7 may include a second initialization gate electrode G7 overlapping a second initialization channel area, a second initialization source electrode S7 and a second initialization drain electrode D7 at both sides of the second initialization gate electrode G7.

The described thin-film transistors may be connected to the signal lines SL, SL−1, SL+1, EL, and DL, the initialization voltage line VL, and the driving voltage line PL.

The second scan line SL, the first scan line SL−1, the emission control line EL, and the driving gate electrode G1 may be arranged on the semiconductor layer 1130 with (an) insulating layer(s) therebetween.

The second scan line SL may extend in an x direction. One or more portions of the second scan line SL may correspond to the switching gate electrode G2 and the compensation gate electrode G3. For example, portions of the second scan line SL, the portions overlapping the switching channel area of the switching thin-film transistor T2 and the compensation channel area of the compensation thin-film transistor T3, may respectively correspond to the switching gate electrode G2 and the compensation gate electrode G3.

The first scan line SL−1 may extend in the x direction, and one or more portions of the first scan line SL−1 may correspond to the first initialization gate electrode G4. For example, portions of the first scan line SL−1, the portions overlapping the first initialization channel areas of the first initialization thin-film transistor T4, may correspond to the first initialization gate electrode G4.

The third scan line SL+1 may extend in the x direction, and one or more portions of the third scan line SL+1 may correspond to the second initialization gate electrode G7. For example, portions of the third scan line SL+1, the portions overlapping the second initialization channel area of the second initialization thin-film transistor T7, may correspond to the second initialization gate electrode G7.

The emission control line EL may extend in the x direction. One or more portions of the emission control line EL may correspond to the operation control gate electrode G5 and the emission control gate electrode G6. For example, portions of the emission control line EL, the portions overlapping the operation control channel area of the operation control thin-film transistor T5 and the emission control channel area of the emission control thin-film transistors T6, may respectively correspond to the operation control gate electrode G5 and the emission control gate electrode G6.

The driving gate electrode G1 may correspond to a floating electrode and may be connected to the compensation thin-film transistor T3 through the node connection line 1174 described above.

An electrode voltage line HL may be arranged on the first scan line SL−1, the second scan line SL, the third scan line SL+1, the emission control line EL, and the driving gate electrode G1 with (an) insulating layer(s) therebetween.

The electrode voltage line HL may extend in the x direction to cross the data line DL and the driving voltage line PL. A portion of the electrode voltage line HL may cover at least a portion of the driving gate electrode G1 and may form the storage capacitor Cst together with the driving gate electrode G1. For example, the driving gate electrode G1 may correspond to a lower electrode CE1 of the storage capacitor Cst, and the portion of the electrode voltage line HL may correspond to an upper electrode CE2 of the storage capacitor Cst.

The upper electrode CE2 of the storage capacitor Cst may be electrically connected to the driving voltage line PL. With respect to this aspect, the electrode voltage line HL may be connected to the driving voltage line PL arranged on the electrode voltage line HL through a contact hole CNT. Thus, the electrode voltage line HL may have the same voltage level (a constant voltage) as the driving voltage line PL. For example, the electrode voltage line HL may have a constant voltage of +5V. The electrode voltage line HL may be understood as a driving voltage line in a lateral direction.

The driving voltage line PL may extend in a y direction, and the electrode voltage line HL electrically connected to the driving voltage line PL may extend in the x direction crossing the y direction. Thus, the plurality of driving voltage lines PL and the electrode voltage lines HL may form a mesh structure in the display area.

The data line DL, the driving voltage line PL, initialization connection line 1173, and the node connection line 1174 may be arranged on the electrode voltage line HL with (an) insulating layer(s) therebetween.

The data line DL may extend in the y direction and may be connected to the switching source electrode S2 of the switching thin-film transistor T2 through a contact hole 1154. A portion of the data line DL may be understood as the switching source electrode S2.

The driving voltage line PL may extend in the y direction and may be connected to the electrode voltage line HL through the contact hole CNT as described above. Also, the driving voltage line PL may be connected to the operation control thin-film transistor T5 through a contact hole 1155. The driving voltage line PL may be connected to the operation control drain electrode D5 through the contact hole 1155.

The initialization voltage line VL may be connected to the first initialization thin-film transistor T4 and the second initialization thin-film transistor T7 through the initialization connection line 1173. The initialization voltage line VL may have a constant voltage (for example, −2 V, etc.).

An end of the node connection line 1174 may be connected to the compensation drain electrode D3 through a contact hole 1156, and the other end of the node connection line 1174 may be connected to the driving gate electrode G1 through a contact hole 1157.

The initialization voltage line VL may be arranged on the data line DL, the driving voltage line PL, the initialization connection line 1173, and the node connection line 1174 with (an) insulating layer(s) therebetween.

The initialization voltage line VL may be arranged on the same layer and may include the same material as the upper electrode CE2 of the storage capacitor Cst. The pixel electrode may be connected to the emission control thin-film transistor T6. The pixel electrode may be connected to a connection electrode CM through a contact hole 1163, and the connection electrode CM may be connected to the emission control drain electrode D6 through a contact hole 1153. According to some example embodiments, the initialization voltage line VL may be arranged on the same layer as a pixel electrode 121 (see FIG. 8A).

Figure 6:
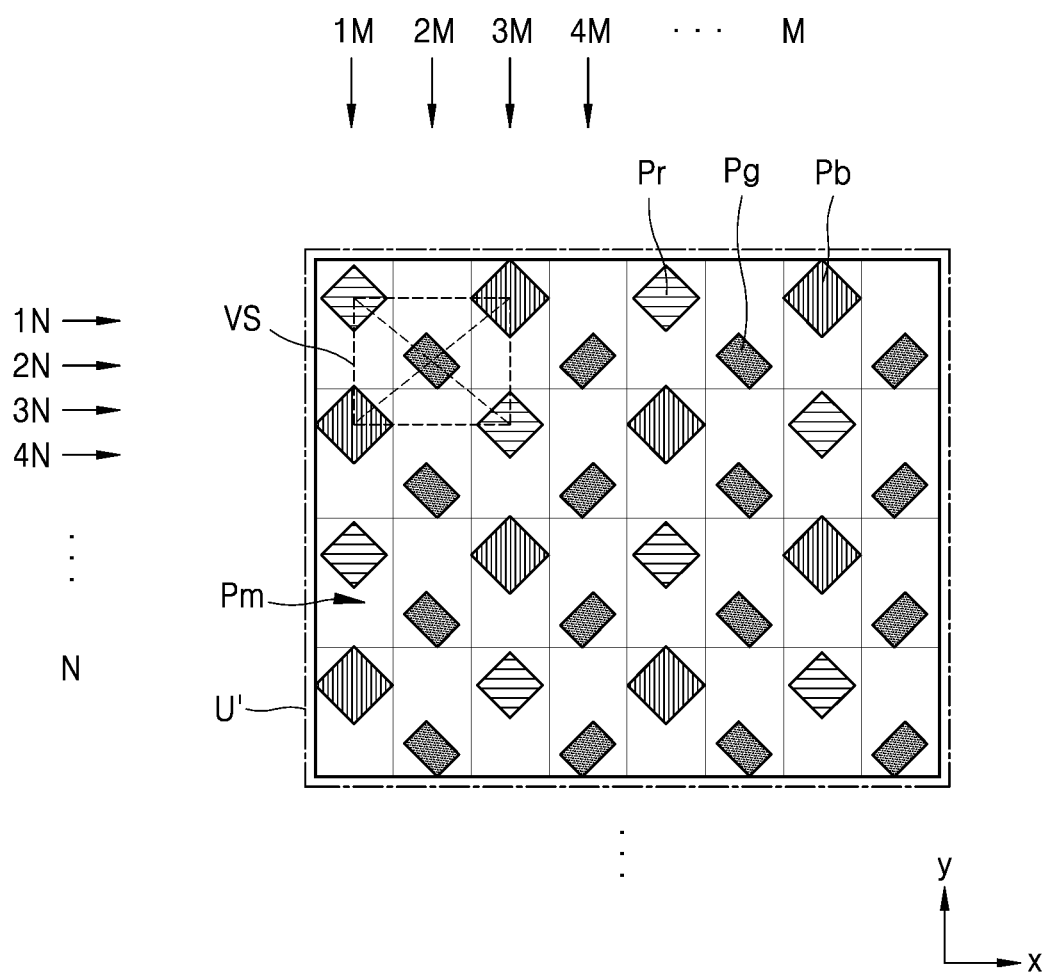
FIG. 6 is a schematic arrangement view of a pixel arrangement structure in a main display area, according to some example embodiments.

FIG. 6 is a schematic arrangement view of a pixel arrangement structure in the main display area MDA, according to some example embodiments.

The plurality of main sub-pixels Pm may be arranged in the main display area MDA. In this specification, the sub-pixel denotes an emission area of a smallest unit for realizing an image. When an organic light-emitting diode is implemented as a display element, the emission area may be defined by an opening of a pixel-defining layer. This aspect will be described below.

As illustrated in FIG. 6, the main sub-pixels Pm arranged in the main display area MDA may be arranged in a pentile structure. A red sub-pixel Pr, a green sub-pixel Pg, and a blue sub-pixel Pb may realize a red color, a green color, and a blue color, respectively.

A plurality of red sub-pixels Pr and a plurality of blue sub-pixels Pb may be alternately arranged in a first row 1N, a plurality of green sub-pixels Pg may be arranged in a second row 2N adjacent to the first row 1N to be apart from the plurality of red sub-pixels Pr and the plurality of blue sub-pixels Pb, a plurality of blue sub-pixels Pb and a plurality of red sub-pixels Pr may be alternately arranged in a third row 3N adjacent to the second row 2N, and a plurality of green sub-pixels Pg may be arranged in a fourth row 4N adjacent to the third row 3N to be apart from the plurality of blue sub-pixels Pb and the plurality of red sub-pixels Pr, wherein these arrangements of the pixels may be repeated through N rows. Here, the blue sub-pixels Pb and the red sub-pixels Pr may be provided to be greater than the green sub-pixels Pg.

The plurality of red sub-pixels Pr and the plurality of blue sub-pixels Pb arranged in the first row 1N may be arranged to be deviated from the plurality of green sub-pixels Pg arranged in the second row 2N. Thus, the plurality of red sub-pixels Pr and the plurality of blue sub-pixels Pb may be alternately arranged in a first column 1M, the plurality of green sub-pixels Pg may be arranged in a second column 2M adjacent to the first column 1M to be apart from the plurality of red sub-pixels Pr and the plurality of blue sub-pixels Pb, the plurality of blue sub-pixels Pb and the plurality of red sub-pixels Pr may be alternately arranged in a third column 3M adjacent to the second column 2M, and the plurality of green sub-pixels Pg may be arranged in a fourth column 4M adjacent to the third column 3M to be apart from the plurality of blue sub-pixels Pb and the plurality of red sub-pixels Pr, wherein these arrangements of the pixels may be repeated through M columns.

To express the pixel arrangement structure in a different way, the red sub-pixels Pr may be arranged at a first vertex and a third vertex of a virtual square VS having a center point as a center point of the green sub-pixels Pg, the first and third vertexes facing each other, and the blue sub-pixels Pb may be arranged at a second vertex and a fourth vertex, which are the other vertexes of the virtual square VS. Here, the virtual square VS may be variously modified to include a rectangular shape, a diamond shape, a square shape, etc.

This pixel arrangement structure may be referred to as a pentile matrix structure or a pentile structure. Also, a rendering operation for representing a color by sharing adjacent pixels may be applied in this structure, in order to achieve a high resolution by using a small number of pixels.

FIG. 6 illustrates that the plurality of main sub-pixels Pm are arranged in the pentile matrix structure. However, embodiments according to the present disclosure are not limited thereto. For example, the plurality of main sub-pixels Pm may be arranged in various shapes, such as a stripe structure, a mosaic arrangement structure, a delta arrangement structure, etc.

Figure 7A:
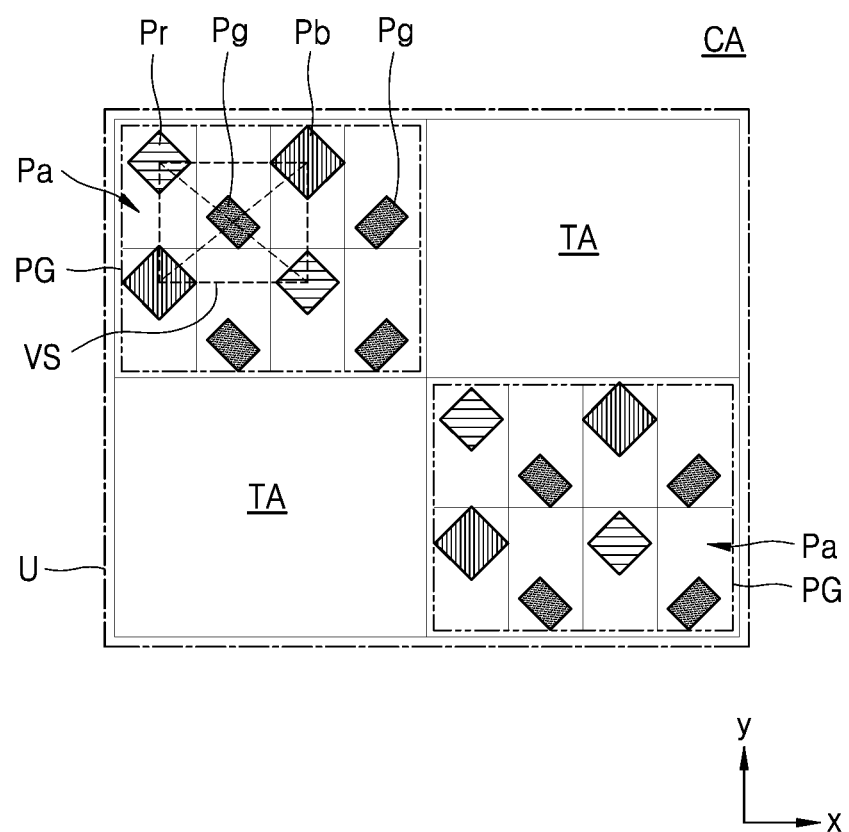
FIGS. 7A and 7B are schematic arrangement views of a pixel arrangement structure in a component area, according to some example embodiments.
Figure 7B:
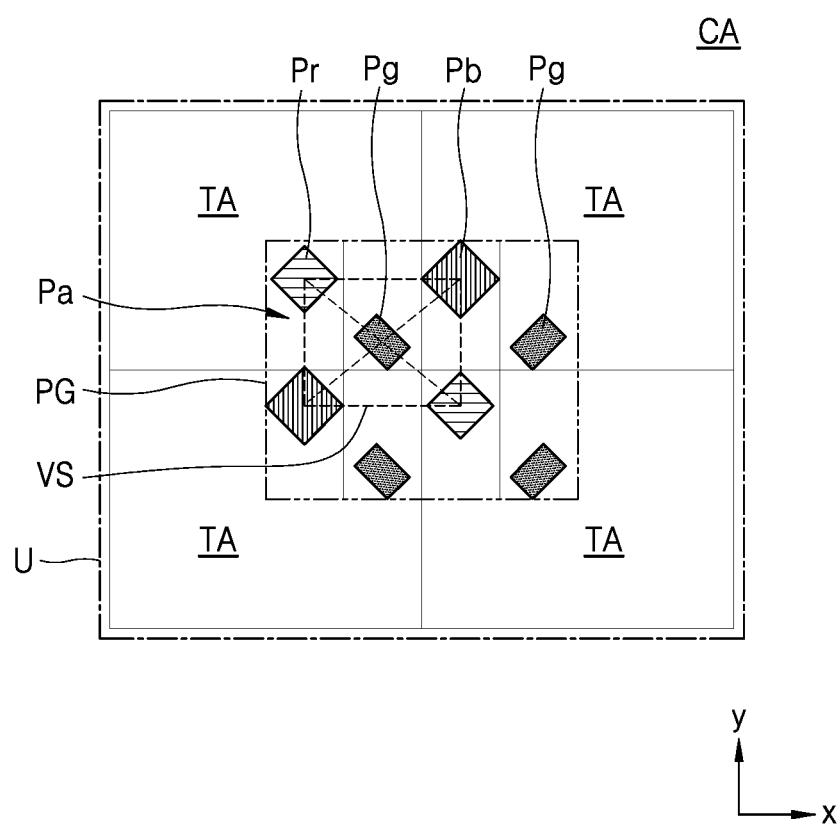

FIGS. 7A and 7B are schematic arrangement views of a pixel arrangement structure in the component area CA, according to embodiments.

Referring to FIG. 7A, the plurality of auxiliary sub-pixels Pa may be arranged in the component area CA. Each of the plurality of auxiliary sub-pixels Pa may emit any one of red, green, blue, and white colors of light.

The component area CA may have a pixel group PG including at least one auxiliary sub-pixel Pa and the transmission area TA. The pixel group PG and the transmission area TA may be alternately arranged in an x direction and a y direction. For example, the pixel group PG and the transmission area TA may be arranged in a grid shape. In this case, the component area CA may have a plurality of pixel groups PG and a plurality of transmission areas TA.

The pixel group PG may be defined as a set of sub-pixels generated by grouping the plurality of auxiliary sub-pixels Pa in a predetermined unit. For example, as illustrated in FIG. 7A, one pixel group PG may include eight auxiliary sub-pixels Pa arranged in a pentile structure. That is, one pixel group PG may include two red sub-pixels Pr, four green sub-pixels Pg, and two blue sub-pixels Pb.

In the component area CA, a basic unit U including a certain number of pixel groups PG and a certain number of transmission areas TA may be repeatedly arranged in the x direction and the y direction. In FIG. 7A, the basic unit U may include two pixel groups PG and two transmission areas TA adjacent to the pixel groups PG, in a square shape. The basic unit U is obtained by dividing repeated shapes, which does not denote that components included in a basic unit U are separate from other components included in another basic unit.

A corresponding unit U' having the same area as the basic unit U may be set on the main display area MDA. In this case, the number of main sub-pixels Pm included in the corresponding unit U' may be greater than the number of auxiliary sub-pixels Pa included in the basic unit U. That is, the basic unit U may include 16 auxiliary sub-pixels Pa and the corresponding unit U' may include 32 main sub-pixels Pm. Accordingly, the number of auxiliary sub-pixels Pa and the number of main sub-pixels Pm arranged in the same area may have a ratio of 1:2.

As illustrated in FIG. 7A, when the auxiliary sub-pixels Pa are arranged in the pentile structure and the resolution of the auxiliary sub-pixels Pa corresponds to ½ of the resolution of the main sub-pixels arranged in the main display area MDA, the pixel arrangement structure may be referred to as a ½ pentile structure. The number and the arrangement structure of auxiliary sub-pixels Pa included in the pixel group PG may be designed to vary according to the resolution of the component area CA.

Referring to FIG. 7B, the pixel arrangement structure of the component area CA may correspond to a ¼ pentile structure. According to some example embodiments, while 8 auxiliary sub-pixels Pa of the pixel group PG may be arranged in the pentile structure, the basic unit U may include only one pixel group PG. The other areas of the basic unit U may be occupied by the transmission area TA. Thus, the number of auxiliary sub-pixels Pa and the number of main sub-pixels Pm arranged per the same area may have a ratio of 1:4. In this case, one pixel group PG may be surrounded by the transmission area TA.

FIGS. 7A and 7B illustrate that the plurality of auxiliary sub-pixels Pa are arranged in the pentile matrix structure. However, embodiments according to the disclosure are not limited thereto. For example, the plurality of auxiliary sub-pixels Pa may be arranged in various shapes, such as a stripe structure, a mosaic arrangement structure, a delta arrangement structure, etc.

Also, FIGS. 7A and 7B illustrate that sizes of the auxiliary sub-pixels Pa are the same as sizes of the main sub-pixels Pm of FIG. 6. However, embodiments according to the present disclosure are not limited thereto. The sizes of the auxiliary sub-pixels Pa may be greater than the sizes of the main sub-pixels Pm with respect to the same color. For example, sizes of blue sub-pixels Pb of the auxiliary sub-pixels Pa may be greater than sizes of blue sub-pixels Pb of the main sub-pixels Pm. The difference in the sizes may be designed by taking into account a difference of brightnesses and/or resolutions between the component area CA and the main display area MDA.

Figure 8A:
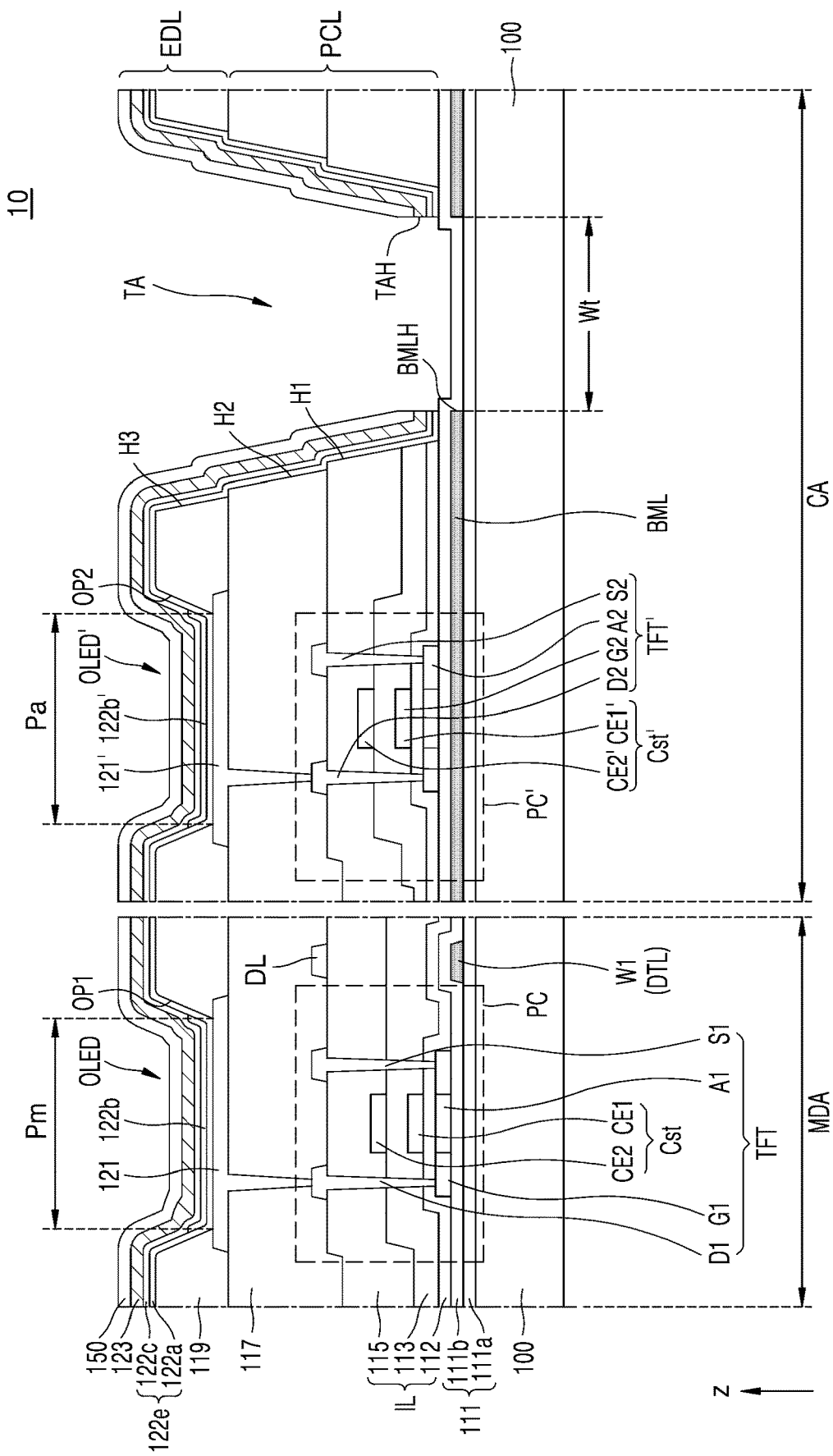
FIG. 8A is a schematic cross-sectional view of a portion of a display panel according to some example embodiments, the portion corresponding to a main display area and a component area.
Figure 8B:
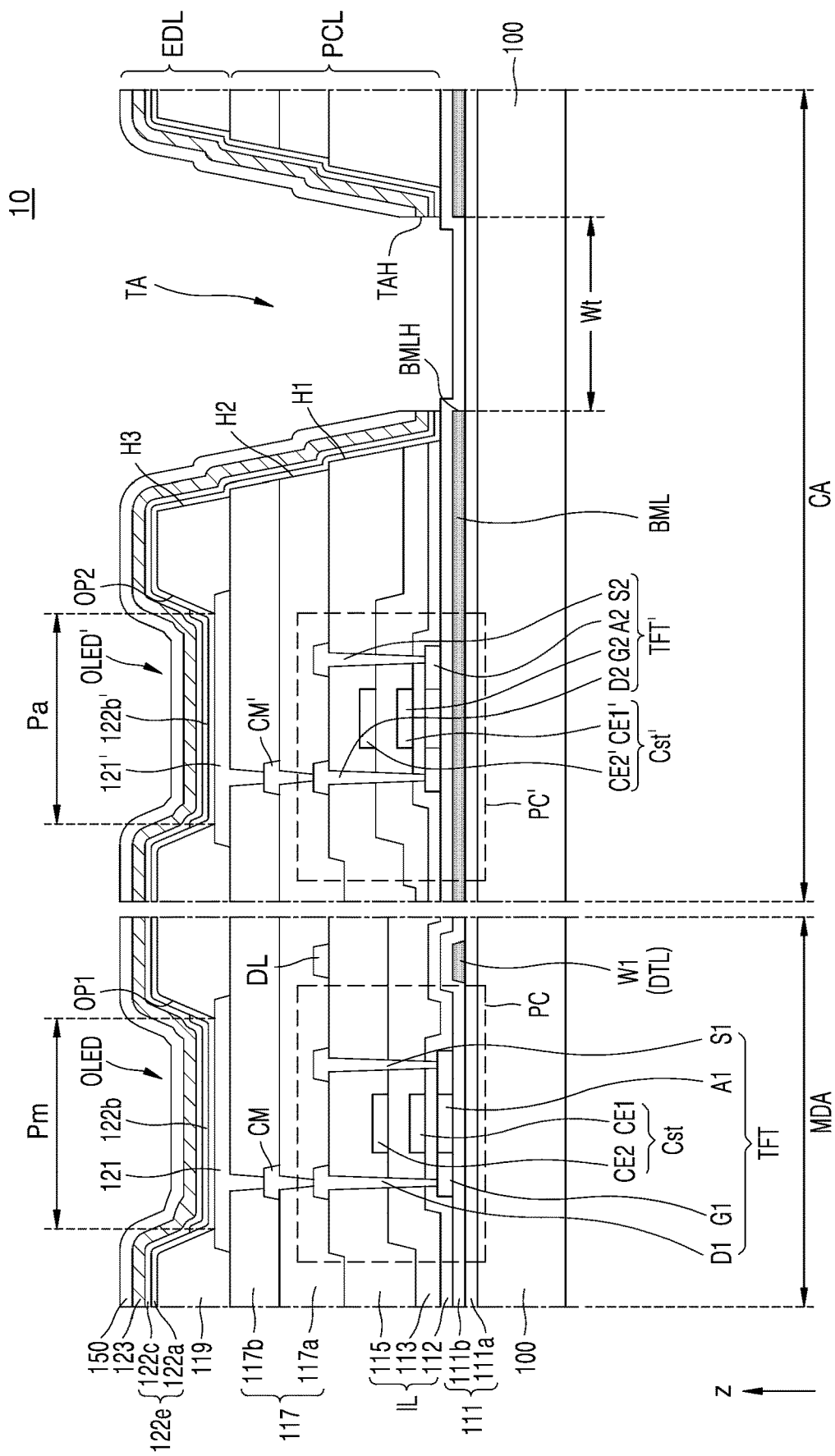
FIG. 8B is a schematic cross-sectional view of a portion of a display panel according to some example embodiments, the portion corresponding to a main display area and a component area.

FIGS. 8A and 8B are schematic cross-sectional views of a portion of the display panel 10 according to embodiments, the portion corresponding to the main display area MDA and the component area CA.

Referring to FIG. 8A, the display panel 10 may include the main display area MDA and the component area CA. The main sub-pixels Pm may be arranged in the main display area MDA, and the auxiliary sub-pixels Pa and the transmission area TA may be arranged in the component area CA. A main pixel circuit PC including a main thin-film transistor TFT and a main storage capacitor Cst and a main organic light-emitting diode OLED, which is a display element connected to the main pixel circuit PC, may be arranged in the main display area MDA. An auxiliary pixel circuit PC' including an auxiliary thin-film transistor TFT' and an auxiliary storage capacitor Cst' and an auxiliary organic light-emitting diode OLED', which is a display element connected to the auxiliary pixel circuit PC', may be arranged in the component area CA.

According to some example embodiments, an example in which the organic light-emitting diodes OLED and OLED' are employed as the display elements is described. However, according to some example embodiments, an inorganic light-emitting element or a quantum dot light-emitting element may be employed as a display element.

Hereinafter, a structure of a stack of the components included in the display panel 10 is described. The display panel 10 may include the substrate 100, a buffer layer 111, the circuit layer PCL, a display element layer EDL, an encapsulation member ENCM, and an optical functional layer OFL that are stacked.

As described above, the substrate 100 may include an insulating material, such as glass, quartz, and polymer resins. The substrate 100 may include a rigid substrate or a flexible substrate, which may be bent, folded, or rolled.

The buffer layer 111 may be located on the substrate 100, may reduce or prevent or reduce penetration of foreign materials, contaminants, moisture, or foreign substances from below the substrate 100, and may provide a planarization surface on the substrate 100. The buffer layer 111 may include an inorganic material, such as oxide or nitride, an organic material, or an organic and inorganic compound, and may have a single-layered structure or a multi-layered structure including an inorganic material and/or an organic material. A barrier layer preventing or reducing the penetration of foreign substances may further be between the substrate 100 and the buffer layer 111. In some example embodiments, the buffer layer 111 may include silicon oxide ($SiO_2$) or silicon nitride ($SiN_x$). The buffer layer 111 may include a first buffer layer 111a and a second buffer layer 111b that are stacked.

In the component area CA, the lower metal layer BML may be arranged between the first buffer layer 111a and the second buffer layer 111b. According to some example embodiments, the lower metal layer BML may be arranged between the substrate 100 and the first buffer layer 111a. The lower metal layer BML may be arranged below the auxiliary pixel circuit PC' and may prevent or reduce instances of the characteristics of the auxiliary thin-film transistor TFT' being degraded due to the light emitted from a component, etc. Also, the lower metal layer BML may prevent or reduce the light emitted from the component or progressing toward the component from being diffracted through a small gap between wires connected to the auxiliary pixel circuit PC'. The lower metal layer BML may not be located in the transmission area TA.

A bias voltage may be applied to the lower metal layer BML. The lower metal layer BML may significantly reduce the probability of the occurrence of electrostatic discharge by receiving the bias voltage. The lower metal layer BML may include Al, Pt, Pd, Ag, Mg, Au, Ni, Nd, Ir, Cr, Ca, Mo, Ti, W, and/or Cu. The lower metal layer BML may include a single layer or multiple layers including the materials described above.

The circuit layer PCL may be arranged above the buffer layer 111 and may include the main and auxiliary pixel circuits PC and PC', a first gate insulating layer 112, a second gate insulating layer 113, an interlayer insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be arranged above the buffer layer 111. The main thin film transistor TFT may include a first semiconductor layer A1, a first gate electrode G1, a first source electrode S1, and a first drain electrode D1, and the auxiliary thin film transistor TFT' may include a second semiconductor layer A2, a second gate electrode G2, a second source electrode S2, and a second drain electrode D2. The main thin-film transistor TFT may be connected to the main organic light-emitting diode OLED and may drive the main organic light-emitting diode OLED. The auxiliary thin-film transistor TFT' may be connected to the auxiliary organic light-emitting diode OLED' and may drive the auxiliary organic light-emitting diode OLED'.

The first semiconductor layer A1 and the second semiconductor layer A2 may be arranged on the buffer layer 111 and may include polysilicon. According to some example embodiments, the first semiconductor layer A1 and the second semiconductor layer A2 may include amorphous silicon. According to some example embodiments, the first semiconductor layer A1 and the second semiconductor layer A2 may include oxide of at least one selected from among the group consisting of In, Ga, Sn, Zr, V, Hf, Cd, Ge, Cr, Ti, and Zn. The first semiconductor layer A1 and the second semiconductor layer A2 may include a channel area, and a source area and a drain area doped with impurities.

The second semiconductor layer A2 may overlap the lower metal layer BML with the second buffer layer 111b therebetween. According to some example embodiments, a width of the second semiconductor layer A2 may be less than a width of the lower metal layer BML, and thus, when viewed from a direction perpendicular to the substrate 100, the second semiconductor layer A2 may entirely overlap the lower metal layer BML.

The first gate insulating layer 112 may be included to cover the first semiconductor layer A1 and the second semiconductor layer A2. The first gate insulating layer 112 may include an inorganic insulating material, such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the organic insulating materials described above.

The first gate electrode G1 and the second gate electrode G2 may be arranged on the first gate insulating layer 112 to overlap the first semiconductor layer A1 and the second semiconductor layer A2, respectively. The first gate electrode G1 and the second gate electrode G2 may include Mo, Al, Cu, Ti, etc., and may include a single layer or multiple layers. For example, the first gate electrode G1 and the second gate electrode G2 may include a single layer including Mo.

The second gate insulating layer 113 may be included to cover the first gate electrode G1 and the second gate electrode G2. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 113 may include a single layer or multiple layers including the organic insulating materials described above.

A first upper electrode CE2 of the main storage capacitor Cst and a second upper electrode CE2' of the auxiliary storage capacitor Cst' may be arranged on the second gate insulating layer 113.

The first upper electrode CE2 may overlap the first gate electrode G1 therebelow in the main display area MDA. The first gate electrode G1 and the first upper electrode CE2 overlapping each other with the second gate insulating layer 113 therebetween may be included in the main storage capacitor Cst. The first gate electrode G1 may correspond to a first lower electrode CE1 of the main storage capacitor Cst.

The second upper electrode CE2' may overlap the second gate electrode G2 therebelow in the component area CA. The second gate electrode G2 and the second upper electrode CE2' overlapping each other with the second gate insulating layer 113 therebetween may be included in the auxiliary storage capacitor Cst'. The first gate electrode G1 may correspond to a second lower electrode CE1' of the auxiliary storage capacitor Cst'.

The first upper electrode CE2 and the second upper electrode CE2' may include Al, Pt, Pd, Ag, Mg, Au, Ni, Nd, Ir, Cr, Ca, Mo, Ti, W, and/or Cu and may include a single layer or multiple layers including the materials described above.

The interlayer insulating layer 115 may be formed to cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, or $ZnO_2$. The interlayer insulating layer 115 may include a single layer or multiple layers including the inorganic insulating materials described above.

When the first gate insulating layer 112, the second gate insulating layer 113, and the interlayer insulating layer 115 are commonly referred to as an inorganic insulating layer IL, the inorganic insulating layer IL may have a first hole H1 corresponding to the transmission area TA. The first hole H1 may expose the buffer layer 111 or a portion of an upper surface of the substrate 100. The first hole H1 may be formed by openings of the first gate insulating layer 112, the second gate insulating layer 113, and the interlayer insulating layer 115 overlapping one another, wherein the openings of the first gate insulating layer 112, the second gate insulating layer 113, and the interlayer insulating layer 115 are formed to correspond to the transmission area TA. The openings may be separately formed in separate processes or simultaneously formed in the same process. When the openings are formed in the separate processes, an inner surface of the first hole H1 may not be smooth and may have a step difference by having a stair shape.

However, the inorganic insulating layer IL may include a groove, rather than the first hole H1 exposing the buffer layer 111. Alternatively, the inorganic insulating layer IL may not have the first hole H1 or the groove corresponding to the transmission area TA. The inorganic insulating layer IL may include an inorganic insulating material having generally excellent light transmittance, and thus, even when there is no hole or groove corresponding to the transmission area TA, sufficient transmittance may be obtained so that the component 40 (see FIG. 2) may transmit/receive a sufficient amount of light.

The data line DL, the source electrodes S1 and S2 and the drain electrodes D1 and D2 may be arranged on the interlayer insulating layer 115. The data line DL, the source electrodes S1 and S2, and the drain electrodes D1 and D2 may include a conductive material including Mo, Al, Cu, Ti, etc. and may include multiple layers or a single layer including the materials described above. For example, the data line DL, the source electrodes S1 and S2, and the drain electrodes D1 and D2 may include a multi-layered structure of Ti/Al/Ti.

The planarization layer 117 may be arranged to cover the data line DL, the source electrodes S1 and S2, and the drain electrodes D1 and D2. The planarization layer 117 may have a planarized upper surface so that a first pixel electrode 121 and a second pixel electrode 121' may be formed thereon to be flat.

The planarization layer 117 may include an organic material or an inorganic material and may have a single-layered structure or a multi-layered structure. The planarization layer 117 may include benzocyclobutene (BCB), PI, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material, such as $SiO_2$, $SiN_x$, SiON, $Al_2O_3$, TiO$_2$, Ta$_2$O$_5$, HfO$_2$, or ZnO$_2$. When forming the planarization layer 117, chemical mechanical polishing may be performed on an upper surface of a layer that is formed, in order to provide a flat upper surface.

The planarization layer 117 may have a second hole H2 corresponding to the transmission area TA. The second hole H2 may overlap the first hole H1. FIG. 8 illustrates that the second hole H2 is greater than the first hole H1. According to some example embodiments, the planarization layer 117 may be provided to cover an edge of the first hole H1 of the inorganic insulating layer IL, and thus, an area of the second hole H2 may be less than an area of the first hole H1.

The planarization layer 117 may have a via-hole exposing any one of the first source electrode S1 and the first drain electrode D1 of the main thin-film transistor TFT, and the first pixel electrode 121 may contact the first source electrode S1 or the first drain electrode D1 through the via-hole to be electrically connected to the main thin-film transistor TFT. Also, the planarization layer 117 may have a via-hole exposing any one of the second source electrode S2 and the second drain electrode D2 of the auxiliary thin-film transistor TFT', and the second pixel electrode 121' may contact the second source electrode S2 or the second drain electrode D2 through the via-hole to be electrically connected to the auxiliary thin-film transistor TFT'.

The first pixel electrode 121 and the second pixel electrode 121' may include conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). The first pixel electrode 121 and the second pixel electrode 121' may include a reflective layer including Ag, Mg, Al, Pt, Pd, Au, Ni, Nd, Ir, Cr, or a compound thereof. For example, the first pixel electrode 121 and the second pixel electrode 121' may have a structure in which layers including ITO, IZO, ZnO, or In$_2$O$_3$ are arranged above/below the reflective layer described above. In this case, the first pixel electrode 121 and the second pixel electrode 121' may have a structure of a stack of ITO/Ag/ITO.

A pixel-defining layer 119 may cover an edge of each of the first pixel electrode 121 and the second pixel electrode 121' above the planarization layer 117 and may include a first opening OP1 and a second opening OP2 exposing central portions of the first pixel electrode 121 and the second pixel electrode 121'. According to the first opening OP1 and the second opening OP2, emission areas of the main and auxiliary organic light-emitting diodes OLED and OLED', that is, sizes and shapes of the main and auxiliary sub-pixels Pm and Pa, may be defined.

The pixel-defining layer 119 may increase a distance between edges of the first and second pixel electrodes 121 and 121' and an opposite electrode 123 on the first and second pixel electrodes 121 and 121' to prevent or reduce instances of arcs, etc. occurring at the edges of the first and second pixel electrodes 121 and 121'. The pixel-defining layer 119 may be formed by using a spin coating method, etc., by using an organic insulating material, such as PI, polyamide, acryl resins, BCB, HMDSO, phenol resins, etc.

The pixel-defining layer 119 may have a third hole H3 corresponding to the transmission area TA. The third hole H3 may overlap the first hole H1 and the second hole H2. Through the first through third holes H1 through H3, the light transmittance of the transmission area TA may be increased. FIG. 7 illustrates that the buffer layer 111 is continually arranged to correspond to the transmission area TA. However, the buffer layer 111 may include a hole located in the transmission area TA. A portion of the opposite electrode 123 to be described below may be arranged at inner surfaces of the first through third holes H1 through H3.

A first emission layer 122b and a second emission layer 122b' formed to correspond to the first pixel electrode 121 and the second pixel electrode 121' respectively may be arranged in the first opening OP1 and the second opening OP2 of the pixel-defining layer 119. The first emission layer 122b and the second emission layer 122b' may include a high molecular-weight material or a low molecular-weight material and may emit red, green, blue, or white light.

An organic functional layer 122e may be arranged above and/or below the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged below the first emission layer 122b and the second emission layer 122b'. The first functional layer 122a may include a single layer or multiple layers including an organic material. The first functional layer 122a may include a hole transport layer (HTL) having a single-layered structure. Alternatively, the first functional layer 122a may include a hole injection layer (HIL) and an HTL. The first functional layer 122a may integrally correspond to the main and auxiliary organic light-emitting diodes OLED and OLED' included in the main display area MDA and the component area CA.

The second functional layer 122c may be arranged above the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may integrally correspond to the main and auxiliary organic light-emitting diodes OLED and OLED' included in the main display area MDA and the component area CA.

The opposite electrode 123 may be arranged above the second functional layer 122c. The opposite electrode 123 may include a conductive material having a low work function. For example, the opposite electrode 123 may include a (semi) transparent layer including Ag, Mg, Al, Pt, Pd, Au, Ni, Nd, Ir, Cr, Li, Ca, or an alloy thereof. Alternatively, the opposite electrode 123 may further include a layer, such as ITO, IZO, ZnO, or In$_2$O$_3$, on the (semi) transparent layer including the materials described above. The opposite electrode 123 may integrally correspond to the main and auxiliary organic light-emitting diodes OLED and OLED' included in the main display area MDA and the component area CA.

Layers formed between the first pixel electrode 121 and the opposite electrode 123 in the main display area MDA may be included in the main organic light-emitting diode OLED. Layers formed between the second pixel electrode 121' and the opposite electrode 123 in the component area CA may be included in the auxiliary organic light-emitting diode OLED.

An upper layer 150 including an organic material may be formed above the opposite electrode 123. The upper layer 150 may be provided to protect the opposite electrode 123 and increase the light extraction efficiency. The upper layer 150 may include an organic material having a higher refractive index than an organic material of the opposite electrode 123. Alternatively, the upper layer 150 may include stacked layers having different refractive indices. For example, the upper layer 150 may be formed by including a high refractive index layer, a low refractive index layer, and a high refractive index layer that are stacked. Here, a refractive index of the high refractive index layer may be about equal to or higher than 1.7 and a refractive index of the low refractive index layer may be about equal to or lower than 1.3.

The upper layer 150 may additionally include LiF. Alternatively, the upper layer 150 may additionally include an inorganic insulating material, such as $SiO_2$, $SiN_x$, etc.

The first functional layer 122a, the second functional layer 122c, the opposite electrode 123, and the upper layer 150 may include a transmission hole TAH corresponding to the transmission area TA. That is, each of the first functional layer 122a, the second functional layer 122c, the opposite electrode 123, and the upper layer 150 may include a hole corresponding to the transmission area TA. Areas of the holes may be substantially the same as one another. For example, the area of the hole of the opposite electrode 123 may be substantially the same as an area of the transmission hole TAH.

That the transmission hole TAH may correspond to the transmission area TA may denote that the transmission hole TAH may overlap the transmission area TA. Here, the area of the transmission hole TAH may be less than an area of the first hole H1 formed in the inorganic insulating layer IL. To this end, FIG. 8 illustrates that a width Wt of the transmission hole TAH is less than a width of the first hole H1. Here, the area of the transmission hole TAH may be defined as the area of the hole having the least area from among the holes included in the transmission hole TAH. Also, the area of the first hole H1 may be defined as an area of a hole having the least area from among holes included in the first hole H1.

Due to the transmission hole TAH, a portion of the opposite electrode 123 may not be in the transmission area TA, and thus, the light transmittance in the transmission area TA may be significantly increased. The opposite electrode 123 having this transmission hole TAH may be formed by using various methods. According to some example embodiments, a material included in the opposite electrode 123 may be formed on the entire surface of the substrate 100, and then, a portion of the material, the portion corresponding to the transmission area TA, may be removed via a laser lift off operation, to form the opposite electrode 123 having the transmission hole TAH. According to some example embodiments, the opposite electrode 123 having the transmission hole TAH may be formed via a metal self patterning (MSP) method. According to some example embodiments, the opposite electrode 123 having the transmission hole TAH may be formed via a method of depositing the opposite electrode 123 by using a fine metal mask (FMM).

The lower metal layer BML of the component area CA may be provided to correspond to the entirety of the component area CA. In this case, the lower metal layer BML may include a lower hole BMLH overlapping the transmission area TA. In some example embodiments, a shape and a size of the transmission area TA may be defined by a shape and a size of the lower hole BMLH.

A line W1 may be arranged on the same layer as the lower metal layer BML in a portion of the main display area MDA. The line W1 may correspond to a detour line DTL (see FIG. 9) detouring the component area CA.

FIG. 8A illustrates that the planarization layer 117 includes a single layer. However, the planarization layer 117 may include a first planarization layer 117a and a second planarization layer 117b as illustrated in FIG. 8B. Accordingly, a conductive pattern, such as lines, etc., may be formed between the first planarization layer 117a and the second planarization layer 117b, so as to have benefits for high integration.

The first planarization layer 117a may be arranged to cover the main and auxiliary pixel circuits PC and PC'. The second planarization layer 117b may be arranged on the first planarization layer 117a and may have a flat upper surface so that the first and second pixel electrodes 121 and 121' may be formed to be flat.

The main and auxiliary organic light-emitting diodes OLED and OLED' may be arranged on the second planarization layer 117b. The first and second pixel electrodes 121 and 121' of the main and auxiliary organic light-emitting diodes OLED and OLED' may be connected to the main and auxiliary pixel circuits PC and PC' through connection electrodes CM and CM' arranged on the planarization layer 117.

The connection electrodes CM and CM' may be arranged between the first planarization layer 117a and the second planarization layer 117b. The connection electrodes CM and CM' may include a conductive material including Mo, Al, Cu, Ti, etc. and may include multiple layers or a single layer including the conductive materials described above. For example, the connection electrodes CM and CM' may include a multi-layered structure of Ti/Al/Ti.

When the first planarization layer 117a and the second planarization layer 117b are provided, it may be assumed that the detour line DTL to be described below may be arranged between the first planarization layer 117a and the second planarization layer 117b. However, when the detour line DTL is arranged on the first planarization layer 117a, the second planarization layer 117b may not have the flat upper surface, and thus, the first pixel electrode 121 may be curved. When the first pixel electrode 121 is curved, reflection may be diffused due to external light to deteriorate the visibility.

According to the present embodiments, the detour line DTL may be arranged to be closer to the substrate 100 than the data line DL so that the effects of the detouring line DTL on the first pixel electrode 121 may be minimized.

Figure 9:
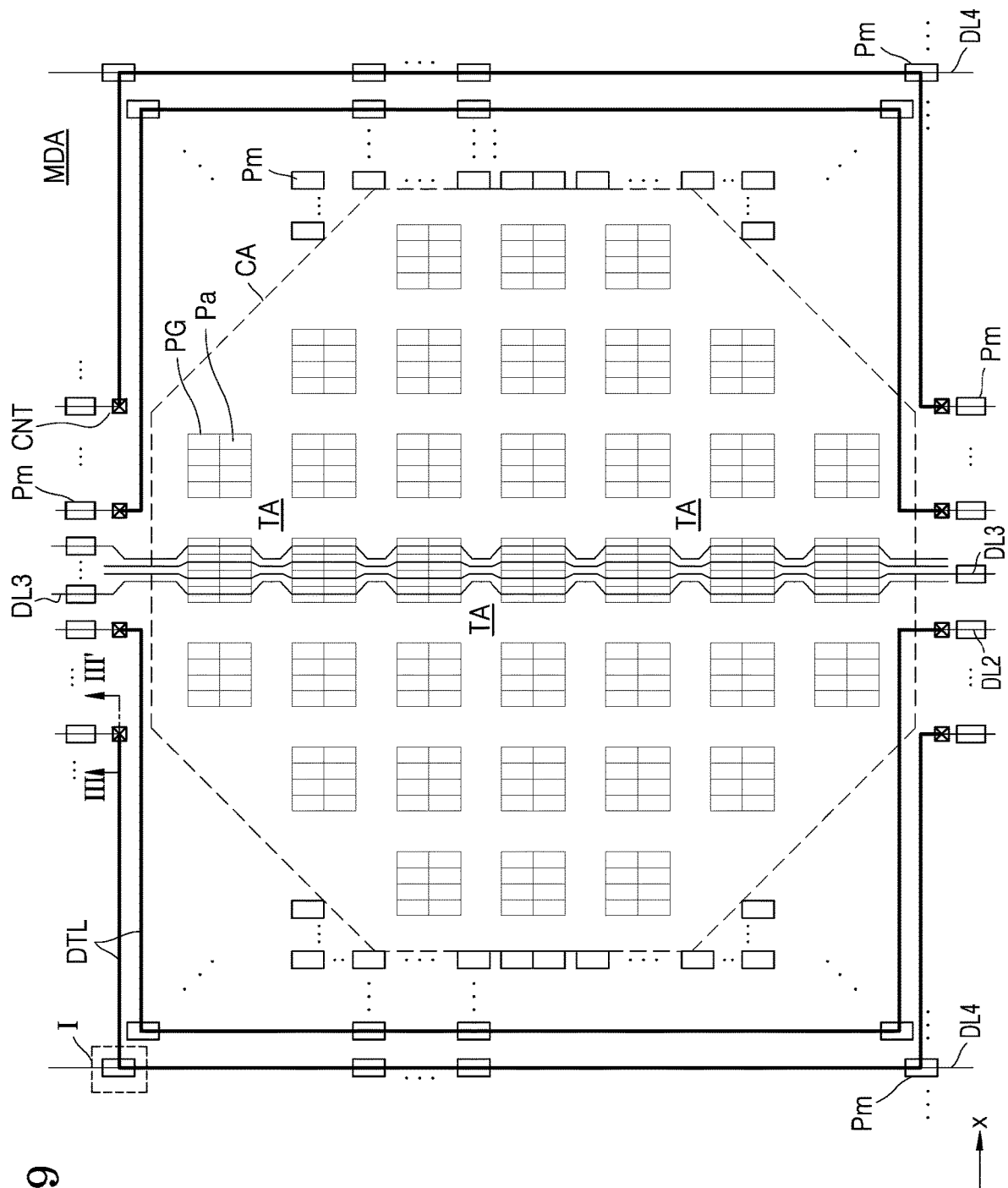
FIG. 9 is a schematic plan view showing an arrangement relationship of sub-pixels of a display panel and one or more lines, according to some example embodiments.
Figure 10:
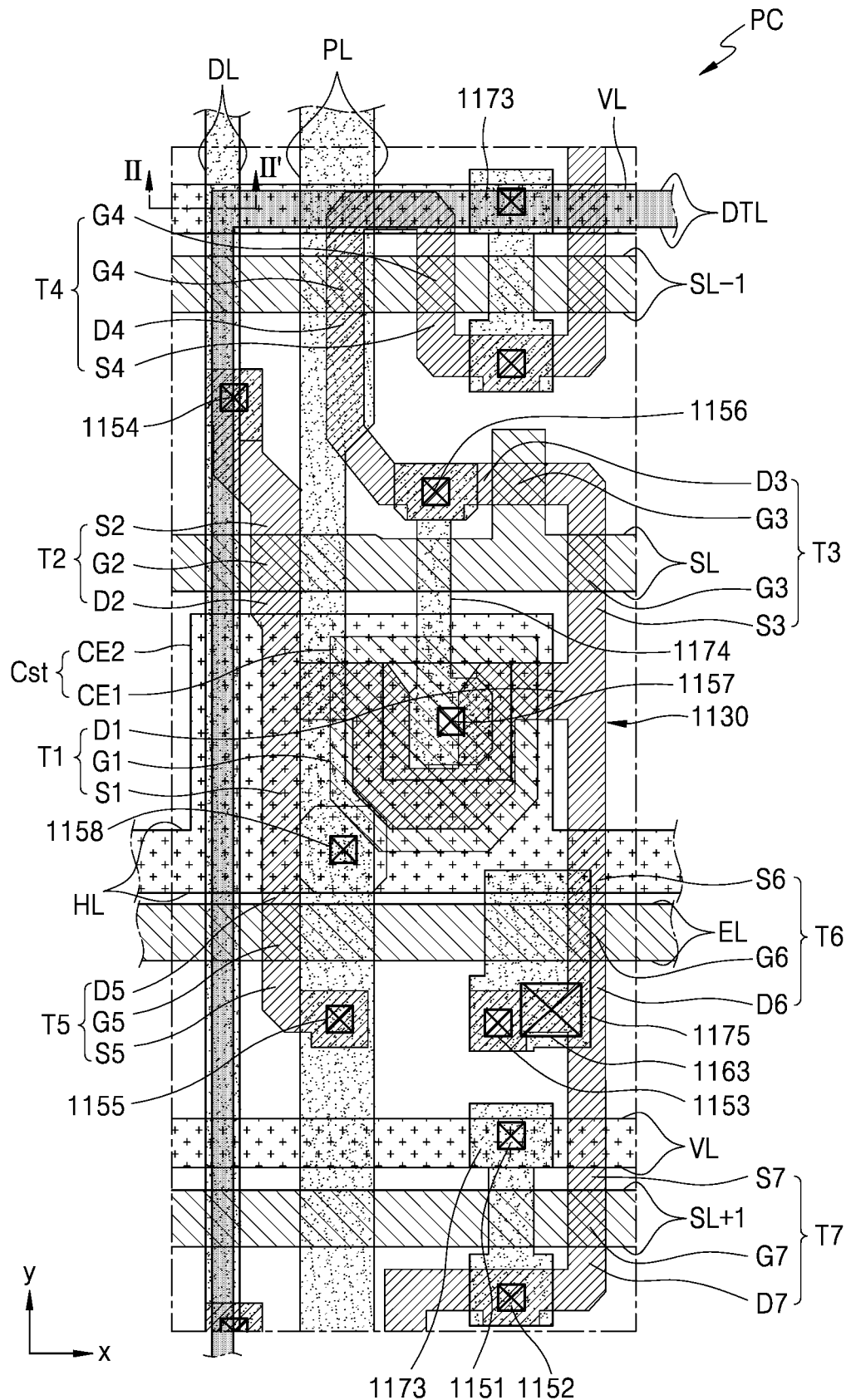
FIG. 10 is an enlarged view of the region I of FIG. 9.
Figure 11:
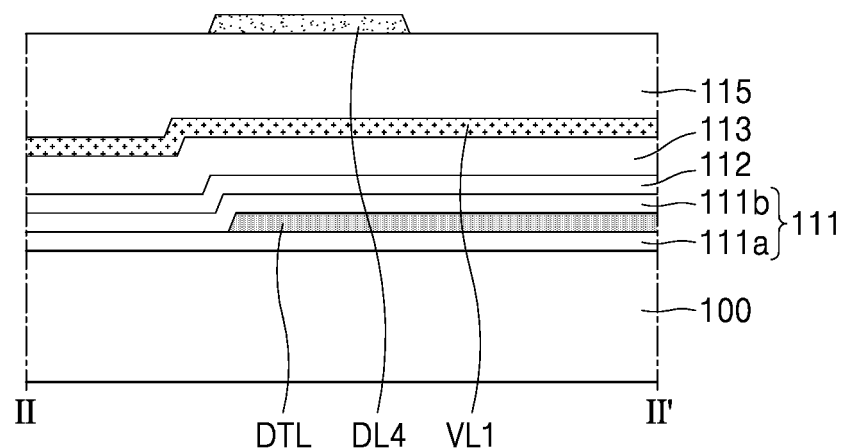
FIG. 11 is a cross-sectional view of the display panel taken along the line II-II' of FIG. 10.
Figure 12:
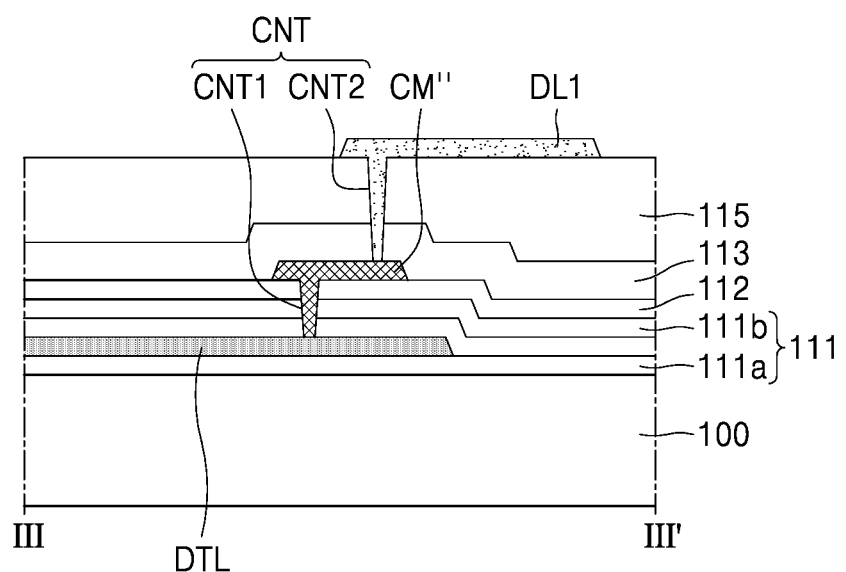
FIG. 12 is a cross-sectional view of the display panel taken along the line III-III' of FIG. 9.

FIG. 9 is a schematic plan view showing an arrangement relationship of sub-pixels of a display panel and one or more lines, according to some example embodiments. This plan view illustrates only a portion of the display panel, and thus, it may be assumed that there are more sub-pixels than the illustrated sub-pixels. Also, this plan view illustrates only lines that are necessary for the explanation, and thus, it may be assumed that there are more lines than the illustrated lines. This plan view illustrates a portion of the component area CA and the main display area MDA outside the component area CA. FIG. 10 is an enlarged view of region I of FIG. 9, and FIG. 11 is a cross-sectional view of the display panel taken along the line II-II' of FIG. 10. FIG. 12 is a cross-sectional view of the display panel taken along the line III-III' of FIG. 9.

Referring to FIG. 9, a plurality of pixel groups PG apart from each other may be arranged in the component area CA, and the transmission area TA may be arranged between the plurality of pixel groups PG. A predetermined number of auxiliary sub-pixels Pa may be arranged in each of the plurality of pixel groups PG.

According to some example embodiments, first through fourth data lines DL1, DL2, DL3, and DL4 may be arranged to extend in a y direction. The first data line DL1 and the second data line DL2 may be arranged to be apart from each other with the component area CA therebetween. The first data line DL1 may be arranged above the component area CA and may be configured to transmit a data signal to main pixel circuits of main sub-pixels Pm arranged above the component area CA. The second data line DL2 may be arranged below the component area CA and may be configured to transmit a data signal to main pixel circuits of main sub-pixels Pm arranged below the component area CA.

The first data line DL1 and the second data line DL2 may be linearly arranged to be apart from each other. The first data line DL1 and the second data line DL2 may be connected to each other via the detour line DTL. The detour line DTL may be bent to detour an edge of the component area CA. The detour line DTL may be arranged in the main display area MDA around the component area CA. The detour line DTL may overlap the main sub-pixels Pm of the main display area MDA, but may not be configured to transmit a data signal to the main sub-pixels Pm overlapping the detour line DTL.

When the detour line DTL is not arranged between the component area CA and the main display area MDA and is arranged in the main display area MDA, a dead space, which may be generated around the component area CA, may be reduced.

The detour line DTL may be arranged on a different layer from the first data line DL1 and the second data line DL2. The detour line DTL may be connected to each of the first data line DL1 and the second data line DL2 through a contact hole.

The third data line DL3 may extend in a y direction to electrically connect the pixel circuits of the main sub-pixels Pm with pixel circuits of auxiliary sub-pixels Pa. The third data line DL3 may be configured to transmit a data signal to the pixel circuits of the main sub-pixels Pm and the pixel circuits of the auxiliary sub-pixels Pa.

A distance between the third data lines DL3 arranged between the plurality of pixel groups PG may be less than a distance between the third data lines DL3 arranged in each pixel group PG. That is, the third data lines DL3 may be bent to obtain the transmission area TA.

Based on this line arrangement structure, the light transmittance of the transmission area TA and the light transmittance of the entirety of the component area CA may be improved. When the distance between the lines arranged in the component area CA is decreased, light diffraction may occur. Thus, the lower metal layer BML may be arranged to overlap the lines arranged in the component area CA.

The fourth data line DL4 may extend in the y direction to electrically connect the pixel circuits of the main sub-pixels Pm. The fourth data line D4 may be configured to provide a data signal to the pixel circuits of the main sub-pixels Pm arranged on the right side or the left side of the component area CA. In some example embodiments, a portion of the detour line DTL, the portion extending in the y direction, may overlap the fourth data line DL4.

The first through fourth data lines DL1 through DL4 may be arranged on the same layer. The first through fourth data lines DL1 through DL4 may be arranged on the interlayer insulating layer 115.

Referring to FIG. 10, which is an enlargement view of region I of FIG. 9, the portion of the detour line DTL, the portion extending in the y direction, may overlap the fourth data line DL4. A portion of the detour line, the portion extending in the x direction, may overlap the initialization voltage line VL.

The detour line DTL may be configured to transmit a data signal provided from the second data line DL2 to the first data line DL1, and thus, based on the data signal provided by the detour line DTL, the main pixel circuit PC overlapping the detour line DTL may be affected. According to some example embodiments, in order to minimize this effect, the detour line DTL may be arranged to overlap the initialization voltage line VL, to which a constant voltage is applied. Alternatively, the detour line DTL may be arranged to overlap the fourth data line DL4, which is arranged to be far from the node connection line 1174 connecting the driving thin-film transistor T1.

Referring to FIG. 11, which is a cross-sectional view of the display panel taken along the line II-II' of FIG. 10, a portion of the detour line DTL may overlap the fourth data line DL4 and the initialization voltage line VL. The detour line DTL may be arranged to be closer to the substrate 100 than the fourth data line DL4 and the initialization voltage line VL. The detour line DTL may be arranged on the same layer as the lower metal layer BML (see FIG. 8A).

As described above, when the detour line DTL is arranged above the fourth data line DL4, the shape of the first pixel electrode 121 (see FIG. 8A) may be affected. Also, when the detour line DTL is arranged to be close to the fourth data line DL4, cross talk may occur due to a data signal. According to some example embodiments, the detour line DTL may be arranged on the same layer as the lower metal layer BML, and thus, the display panel having a high quality may be provided.

Referring to FIG. 12, which is a cross-sectional view of the display panel taken along the line III-III' of FIG. 9, the detour line DTL may be arranged on a different layer from the first data line DL1, and thus, the detour line DTL may be connected to the first data line DL1 through the contact hole CNT defined by an insulating layer. In some example embodiments, a connection electrode CM" may be arranged between the detour line DTL and the first data line DL1. The connection electrode CM" may be arranged on the first gate insulating layer 112. In this case, the connection electrode CM" may be connected to the detour line DTL through a first contact hole CNT1 penetrating the first gate insulating layer 112 and the second buffer layer 111b, and the first data line DL1 may be connected to the connection electrode CM" through a second contact hole CNT2 penetrating the interlayer insulating layer 115 and the second gate insulating layer 113.

As described above, according to the display panel and the display apparatus according to the one or more of the above embodiments of the disclosure, because the detour line DTL detouring the component area CA may be arranged in the main display area MDA, an area of the transmission area TA of the component area CA may be increased. Also, because the detour line DTL may be arranged on the same layer as the lower metal layer BML, the quality of the display panel and the display apparatus may be improved.

However, the scope of embodiments according to the present disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel having a main display area, a component area including pixel groups spaced apart from each other, and a transmission area between the pixel groups, the display panel comprising:
   a substrate;
   a plurality of main display elements on the substrate to correspond to the main display area and main pixel circuits respectively connected to the main display elements;
   auxiliary display elements on the substrate to respectively correspond to the pixel groups and auxiliary pixel circuits respectively connected to the auxiliary display elements;
   a first data line and a second data line spaced apart from each other with the component area therebetween;
   a detour line connecting the first data line to the second data line,
   wherein the detour line is on a layer that is closer to the substrate than a layer on which the first data line and the second data line are arranged; and
   a lower metal layer in the component area between the substrate and the auxiliary pixel circuits and including a lower hole corresponding to the transmission area,
   wherein the detour line is coplanar with the lower metal layer on a plane that is parallel to a bottom surface of the substrate.

2. The display panel of claim 1, wherein at least a portion of the detour line is in the main display area.

3. The display panel of claim 1, further comprising a third data line in the component area and connected to the auxiliary pixel circuits.

4. The display panel of claim 1, further comprising an initialization voltage line configured to transmit an initialization voltage to the main pixel circuits in the main display area and extending in a first direction, wherein a portion of the detour line, the portion extending in the first direction, overlaps the initialization voltage line.

5. The display panel of claim 1, wherein a portion of the detour line extending in a second direction that is parallel to the first data line overlaps a fourth data line connecting the main pixel circuits in the main display area.

6. The display panel of claim 1, further comprising a connection electrode between the detour line and the first data line,
   wherein the connection electrode is connected to the detour line through a first contact hole, and the first data line is connected to the connection electrode through a second contact hole.

7. A display panel having a main display area, a component area including pixel groups spaced apart from each other, and a transmission area between the pixel groups, the display panel comprising:
   a substrate;
   main display elements on the substrate to correspond to the main display area and main pixel circuits respectively connected to the main display elements;
   auxiliary display elements on the substrate to respectively correspond to the pixel groups and auxiliary pixel circuits respectively connected to the auxiliary display elements;
   a lower metal layer in the component area between the substrate and the auxiliary pixel circuits and including a lower hole corresponding to the transmission area;
   a first data line and a second data line apart from each other with the component area therebetween; and
   a detour line connecting the first data line to the second data line,
   wherein the detour line is coplanar with the lower metal layer on a plane that is parallel to a bottom surface of the substrate.

8. The display panel of claim 7, wherein the main pixel circuits include a driving thin-film transistor, a switching thin-film transistor, and an initialization thin-film transistor, and
   a portion of the detour line, the portion extending in a first direction, overlaps an initialization voltage line configured to transmit an initialization voltage to the initialization thin-film transistor.

9. The display panel of claim 8, wherein a portion of the detour line extending in a second direction crossing the first direction at least partially overlaps a fourth data line configured to transmit a data signal to the switching thin-film transistor.

10. The display panel of claim 7, further comprising a connection electrode between the detour line and the first data line,
    wherein the connection electrode is connected to the detour line through a first contact hole, and the first data line is connected to the connection electrode through a second contact hole.

11. The display panel of claim 7, further comprising a third data line in the component area and connected to the auxiliary pixel circuits.

12. The display panel of claim 11, wherein the third data line is curved along a shape of the transmission area.

13. A display apparatus comprising:
    a display panel having a main display area including main sub-pixels, a component area including a plurality of pixel groups, and a transmission area; and
    a component below the display panel to correspond to the component area, wherein the display panel further includes:
    a substrate;
    main display elements on the substrate to correspond to the main display area and main pixel circuits respectively connected to the main display elements;
    auxiliary display elements on the substrate to respectively correspond to the pixel groups and auxiliary pixel circuits respectively connected to the auxiliary display elements;
    a first data line and a second data line apart from each other with the component area therebetween;
    a detour line connecting the first data line to the second data line,
    wherein the detour line is on a layer that is closer to the substrate than a layer on which the first data line and the second data line are arranged; and
    a lower metal layer in the component area between the substrate and the auxiliary pixel circuits and including a lower hole corresponding to the transmission area,
    wherein the detour line is coplanar with the lower metal layer on a plane that is parallel to a bottom surface of the substrate.

14. The display apparatus of claim 13, wherein at least a portion of the detour line is in the main display area.

15. The display apparatus of claim 13, further comprising a third data line in the component area and connected to the auxiliary pixel circuits.

16. The display apparatus of claim 13, further comprising an initialization voltage line configured to transmit an initialization voltage to the main pixel circuits in the main display area and extending in a first direction, wherein a portion of the detour line extending in the first direction overlaps the initialization voltage line.

17. The display apparatus of claim 13, wherein a portion of the detour line extending in a second direction that is parallel to the first data line overlaps a fourth data line connecting the main pixel circuits in the main display area.

18. The display apparatus of claim 13, further comprising a connection electrode between the detour line and the first data line,
    wherein the connection electrode is connected to the detour line through a first contact hole, and the first data line is connected to the connection electrode through a second contact hole.

\* \* \* \* \*